(12) United States Patent
Feng et al.

(10) Patent No.: US 11,508,297 B2
(45) Date of Patent: Nov. 22, 2022

(54) DISPLAY DEVICE, GATE DRIVE CIRCUIT, SHIFT REGISTER CIRCUIT AND DRIVING METHOD THEREOF FOR PREVENTING LEAKAGE CURRENTS

(71) Applicants: Hefei BOE Joint Technology Co.,Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/420,120

(22) PCT Filed: Sep. 28, 2020

(86) PCT No.: PCT/CN2020/118493
§ 371 (c)(1),
(2) Date: Jun. 30, 2021

(87) PCT Pub. No.: WO2021/063322
PCT Pub. Date: Apr. 8, 2021

(65) Prior Publication Data
US 2022/0051618 A1  Feb. 17, 2022

(30) Foreign Application Priority Data
Sep. 30, 2019 (CN) .......................... 201910940577.3

(51) Int. Cl.
*G09G 5/00* (2006.01)
*G09G 3/3225* (2016.01)
(Continued)

(52) U.S. Cl.
CPC ........... *G09G 3/3225* (2013.01); *G11C 19/28* (2013.01); *G09G 3/20* (2013.01); *G09G 3/3233* (2013.01);
(Continued)

(58) Field of Classification Search
CPC ................. G11C 19/28; G09G 3/3225; G09G 2310/0286; G09G 2310/061; G09G 3/3233; G09G 3/3266; G09G 3/20
See application file for complete search history.

(56) References Cited

U.S. PATENT DOCUMENTS 8,867,697 B2   10/2014  Jang et al.
2005/0264514 A1  12/2005  Kim et al.
(Continued)

FOREIGN PATENT DOCUMENTS

CN    1705042 A    12/2005
CN    102610206 A   7/2012
(Continued)

OTHER PUBLICATIONS

First Office Action of Priority Application No. CN 201910940577.3 issued by the Chinese Patent Office dated Feb. 2, 2021.
(Continued)

*Primary Examiner* — Adam J Snyder
(74) *Attorney, Agent, or Firm* — IP & T Group LLP

(57) ABSTRACT

A shift register circuit is provided. The shift register circuit includes an input sub-circuit, an output sub-circuit, a first control sub-circuit and a second control sub-circuit. The input sub-circuit is connected to a first signal input terminal, a second signal input terminal and a first node. The output sub-circuit is connected to the first node, a first clock signal terminal and a first output terminal. The first control sub-circuit is connected to a first power supply voltage terminal, a second power supply voltage terminal, the first node and
(Continued)

a second node. The second control sub-circuit is connected to the second power supply voltage terminal, a third power supply voltage terminal, the second node and a third node, and the third node is further connected to the input sub-circuit.

20 Claims, 13 Drawing Sheets

(51) Int. Cl.
    *G11C 19/28*      (2006.01)
    *G09G 3/3233*      (2016.01)
    *G09G 3/3266*      (2016.01)
    *G09G 3/20*      (2006.01)

(52) U.S. Cl.
    CPC ... *G09G 3/3266* (2013.01); *G09G 2310/0286* (2013.01); *G09G 2310/061* (2013.01)

(56) References Cited

U.S. PATENT DOCUMENTS

| | | | |
|---|---|---|---|
| 2009/0122951 A1 | 5/2009 | Tobita | |
| 2010/0111245 A1 | 5/2010 | Tobita | |
| 2011/0058640 A1* | 3/2011 | Shang | G11C 19/28 377/64 |
| 2014/0093028 A1* | 4/2014 | Wu | G11C 19/28 377/64 |
| 2015/0123886 A1 | 5/2015 | Chen | |
| 2016/0266699 A1 | 9/2016 | Zhao et al. | |
| 2017/0294165 A1* | 10/2017 | Park | G09G 3/3266 |
| 2018/0190232 A1 | 7/2018 | Xue et al. | |
| 2018/0366067 A1* | 12/2018 | Jang | G09G 3/3677 |
| 2019/0096311 A1 | 3/2019 | Park et al. | |
| 2019/0130848 A1* | 5/2019 | Kim | G09G 3/3266 |
| 2020/0051507 A1 | 2/2020 | Feng et al. | |
| 2021/0201774 A1 | 7/2021 | Feng et al. | |
| 2021/0201807 A1 | 7/2021 | Feng et al. | |
| 2021/0350739 A1 | 11/2021 | Hu et al. | |

FOREIGN PATENT DOCUMENTS

| | | |
|---|---|---|
| CN | 104021769 A | 9/2014 |
| CN | 106205520 A | 12/2016 |
| CN | 106486082 A | 3/2017 |
| CN | 107909959 A | 4/2018 |
| CN | 108711401 A | 10/2018 |
| CN | 108831403 A | 11/2018 |
| CN | 109559684 A | 4/2019 |
| CN | 109935187 A | 6/2019 |
| CN | 109935204 A | 6/2019 |
| KR | 10-2011-0114836 A | 10/2011 |

OTHER PUBLICATIONS

Notification to Grant Patent Right for invention of Priority Application No. CN 201910940577.3 issued by the Chinese Patent Office dated Jul. 19, 2021.

* cited by examiner

DISPLAY DEVICE, GATE DRIVE CIRCUIT, SHIFT REGISTER CIRCUIT AND DRIVING METHOD THEREOF FOR PREVENTING LEAKAGE CURRENTS

CROSS-REFERENCE TO RELATED APPLICATIONS

This application is a national phase entry under 35 USC 371 of International Patent Application No. PCT/CN2020/118493 filed on Sep. 28, 2020, which claims priority to Chinese Patent Application No. 201910940577.3, filed on Sep. 30, 2019, which are incorporated herein by reference in their entirety.

TECHNICAL FIELD

The present disclosure relates to the field of display technologies, and in particular, to a display device, a gate drive circuit, a shift register circuit and a driving method thereof.

BACKGROUND

In a field of display technologies, oxide thin film transistors (TFTs) are commonly used in a shift register circuit. However, since oxide TFTs are depletion mode transistors, a gate leakage situation often occurs in practical applications, and electric leakage of the oxide TFTs may cause output cascade of the gate drive circuit to be incomplete, so that output terminals of the shift register circuit are abnormal.

SUMMARY

In one aspect, a shift register circuit is provided. The shift register circuit includes an input sub-circuit, an output sub-circuit, a first control sub-circuit and a second control sub-circuit. The input sub-circuit is connected to a first signal input terminal, a second signal input terminal and a first node. The input sub-circuit is configured to transmit a second input signal from the second signal input terminal to the first node in response to a first input signal received from the first input signal terminal. The output sub-circuit is connected to the first node, a first clock signal terminal and a first output terminal. The output sub-circuit is configured to store the second input signal at the first node, and transmit a first clock signal from the first clock signal terminal to the first output terminal in response to the second input signal at the first node. The first control sub-circuit is connected to a first power supply voltage terminal, a second power supply voltage terminal, the first node and a second node. The first control sub-circuit is configured to transmit a first voltage signal to the second node in response to the first voltage signal received from the first power supply voltage terminal, and transmit a second voltage signal to the second node in response to the second input signal at the first node. The second control sub-circuit is connected to the second power supply voltage terminal, a third power supply voltage terminal, the second node and a third node, and the third node is further connected to the input sub-circuit. The second control sub-circuit is configured to transmit a third voltage signal to the third node in response to the third voltage signal received from the third power supply voltage terminal, and disconnect the third power supply voltage terminal from the third node in response to the first voltage signal at the second node and the second voltage signal from the second power supply voltage terminal.

In some embodiments, the input sub-circuit includes a first transistor and a second transistor. A gate of the first transistor is connected to the first signal input terminal, a first electrode of the first transistor is connected to the second signal input terminal, and a second electrode of the first transistor is connected to a first electrode of the second transistor. A gate of the second transistor is connected to the first signal input terminal, and a second electrode of the second transistor is connected to the first node. The first electrode of the second transistor is further connected to the third node.

In some embodiments, the first control sub-circuit includes a third transistor and a fourth transistor. A gate and a first electrode of the third transistor are both connected to the first power supply voltage terminal, and a second electrode of the third transistor is connected to the second node. A gate of the fourth transistor is connected to the first node, a first electrode of the fourth transistor is connected to the second node, and a second electrode of the fourth transistor is connected to the second power supply voltage terminal. A width-to-length ratio of a channel of the fourth transistor is greater than a width-to-length ratio of a channel of the third transistor.

In some embodiments, the second control sub-circuit 40 includes a fifth transistor, a sixth transistor and a seventh transistor. A gate and a first electrode of the fifth transistor are both connected to the third power supply voltage terminal, and a second electrode of the fifth transistor is connected to a fourth node. A gate of the sixth transistor is connected to the second node, a first electrode of the sixth transistor is connected to the fourth node, and a second electrode of the sixth transistor is connected to the second power supply voltage terminal. A gate and a first electrode of the seventh transistor are both connected to the fourth node, and a second electrode of the seventh transistor is connected to the third node. A width-to-length ratio of a channel of the sixth transistor is greater than a width-to-length ratio of a channel of the fifth transistor.

In some embodiments, the output sub-circuit includes an eighth transistor and a capacitor. A gate of the eighth transistor is connected to the first node, a first electrode of the eighth transistor is connected to the first clock signal terminal, and a second electrode of the eighth transistor is connected to the first output terminal. One end of the capacitor is connected to the first node, and another end of the capacitor is connected to the first output terminal.

In some embodiments, the output sub-circuit is further connected to a second clock signal terminal and a second output terminal. The output sub-circuit is further configured to transmit a second clock signal of the second clock signal terminal to the second output terminal in response to the second input signal at the first node.

In some embodiments, the output sub-circuit includes an eighth transistor, a ninth transistor and a capacitor. A gate of the eighth transistor is connected to the first node, a first electrode of the eighth transistor is connected to the first clock signal terminal, and a second electrode of the eighth transistor is connected to the first output terminal. A gate of the ninth transistor is connected to the first node, a first electrode of the ninth transistor is connected to the second clock signal terminal, and a second electrode of the ninth transistor is connected to the second output terminal. One end of the capacitor is connected to the first node, and another end of the capacitor is connected to the first output terminal.

In some embodiments, the shift register circuit further includes a first reset sub-circuit. The first reset sub-circuit is connected to a first reset signal terminal, the first node and the second power supply voltage terminal. The first reset sub-circuit is configured to transmit the second voltage signal to the first node in response to a first reset signal received from the first reset signal terminal, so as to reset the first node.

In some embodiments, the first reset sub-circuit includes a tenth transistor and a eleventh transistor. A gate of the tenth transistor is connected to the first reset signal terminal, a first electrode of the tenth transistor is connected to the first node, and a second electrode of the tenth transistor is connected to a first electrode of the eleventh transistor. A gate of the eleventh transistor is connected to the first reset signal terminal, and a second electrode of the eleventh transistor is connected to the second power supply voltage terminal.

In some embodiments, the second electrode of the tenth transistor is further connected to the third node.

In some embodiments, the shift register circuit further includes a denoising sub-circuit. The denoising sub-circuit is connected to the first node, the second node, the first output terminal and the second power supply voltage terminal. The denoising sub-circuit is configured to transmit the second voltage signal to the first node and the first output terminal in response to the first voltage signal at the second node.

In some embodiments, the denoising sub-circuit includes a first denoising sub-circuit and a second denoising sub-circuit. The first denoising sub-circuit is connected to the first node, the second node and the second power supply voltage terminal. The first denoising sub-circuit is configured to transmit the second voltage signal to the first node in response to the first voltage signal at the second node. The second denoising sub-circuit is connected to the second node, the first output terminal and the second power supply voltage terminal. The second denoising sub-circuit is configured to transmit the second voltage signal to the first output terminal in response to the first voltage signal at the second node.

In some embodiments, the first denoising sub-circuit includes a twelfth transistor and a thirteenth transistor. A gate of the twelfth transistor is connected to the second node, a first electrode of the twelfth transistor is connected to the first node, a second electrode of the twelfth transistor is connected to a first electrode of the thirteenth transistor, and the second electrode of the twelfth transistor is further connected to the third node. A gate of the thirteenth transistor is connected to the second node, and the second electrode of the thirteenth transistor is connected to the second power supply voltage terminal.

In some embodiments, the second denoising sub-circuit includes a fourteenth transistor. A gate of the fourteenth transistor is connected to the second node, a first electrode of the fourteenth transistor is connected to the first output terminal, and a second electrode of the fourteenth transistor is connected to the second power supply voltage terminal.

In some embodiments, the output sub-circuit is further connected to a second clock signal terminal and a second output terminal. The denoising sub-circuit further includes a third denoising sub-circuit, and the third denoising includes fifteenth transistor. A gate of the fifteenth transistor is connected to the second node, the first electrode of the fifteenth transistor is connected to the second output terminal, and the second electrode of the fifteenth transistor is connected to the second power supply voltage terminal.

In some embodiments, the shift register circuit further includes a second reset sub-circuit. The second reset sub-circuit is connected to a second reset signal terminal, the first node and the second power supply voltage terminal. The second reset sub-circuit is configured to transmit the second voltage signal to the first node in response to a second reset signal received from the second reset signal terminal, so as to reset the first node.

In some embodiments, the second reset sub-circuit includes a sixteenth transistor and a seventeenth transistor. A gate of the sixteenth transistor is connected to the second reset signal terminal, a first electrode of the sixteenth transistor is connected to the first node, and a second electrode of the sixteenth transistor is connected to a first electrode of the seventeenth transistor and the third node. A gate of the seventeenth transistor is connected to the second reset signal terminal, and a second electrode of the seventeenth transistor is connected to the second power supply voltage terminal.

In another aspect, a gate drive circuit is provided. The gate drive circuit includes a plurality of stages of shift register circuits, and each stage of shift register circuit is the shift register circuit according to any one of embodiments described above.

In some embodiments, a first signal input terminal and a first reset signal terminal of a Nth-stage shift register circuit are respectively connected to a first output terminal of a (N−2)th-stage shift register circuit and a first output terminal of a (N+3)th-stage shift register circuit, where N is an integer greater than 2.

In yet another aspect, a display device is provided. The display device includes the gate drive circuit according to some embodiments described above.

In yet another aspect, a driving method of a shift register circuit is provided. The driving method is used for driving the shift register circuit according to any one of embodiments described above. The driving method includes: transmitting, by the input sub-circuit, the second input signal from the second signal input terminal to the first node in response to the first input signal received from the first signal input terminal; storing, by the output sub-circuit, the second input signal at the first node; transmitting, by the output sub-circuit, the first clock signal of the first clock signal terminal to the first output terminal in response to the second input signal at the first node; transmitting, by the first control sub-circuit, the first voltage signal to the second node in response to the first voltage signal received from the first power supply voltage terminal; transmitting, by the first control sub-circuit, the second voltage signal of the second power supply voltage terminal to the second node in response to the second input signal at the first node; transmitting, by the second control sub-circuit, the third voltage signal to the third node in response to the third voltage signal received from the third power supply voltage terminal; and disconnecting, by the second control sub-circuit, the third power supply voltage terminal from the third node in response to the first voltage signal at the second node and the second voltage signal from the second power supply voltage terminal.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "inclusive, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, features defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its extensions may be used. For example, the term "connected" may be used in the description of some embodiments to indicate that two or more components are in direct physical contact or in electrical contact with each other. The embodiments disclosed herein are not necessarily limited to the contents herein.

The use of the phrase "configured to" means an open and inclusive language, which does not exclude devices that are configured to perform additional tasks or steps.

Figure 1:
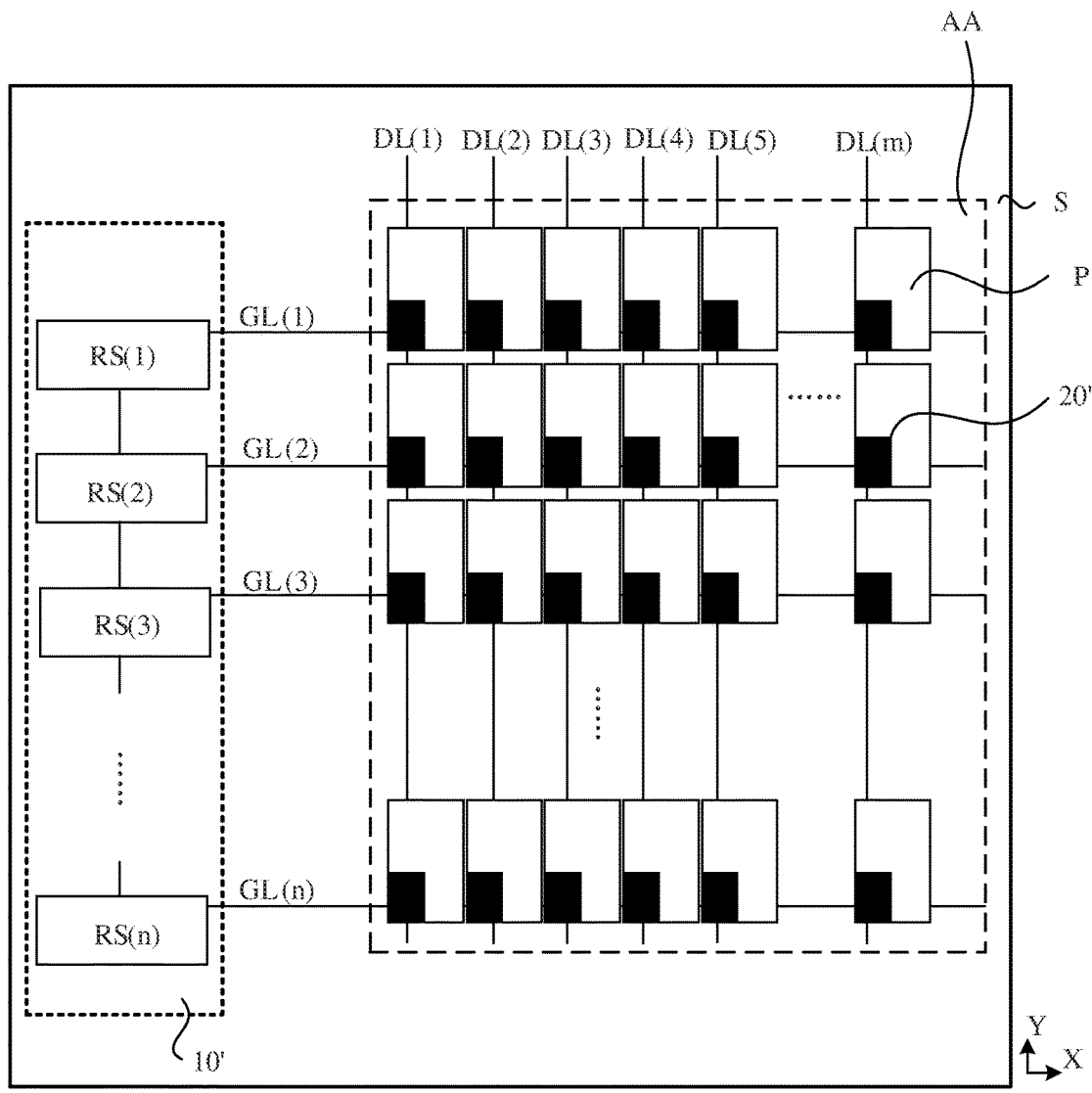
FIG. 1 is a schematic structural diagram of a display panel in accordance with some embodiments.

Some embodiments of the present disclosure provide a display device. The display device includes a display panel 100 as shown in FIG. 1. The display panel 100 has an active area AA and a peripheral area S located at at least one side of the active area AA. For example, as shown in FIG. 1, the peripheral area S is disposed around the active area AA.

As shown in FIG. 1, the display panel 100 includes a plurality of sub-pixels P disposed in the active area AA. In some embodiments, the plurality of sub-pixels P at least include a plurality of first color sub-pixels, a plurality of second color sub-pixels and a plurality of third color sub-pixels, and the first color, the second color and the third color are three primary colors such as red, green and blue.

In the following embodiments, for convenience of description, sub-pixels P arranged in a same line in a horizontal direction X are referred to as a row of sub-pixels, sub-pixels P arranged in a same line in a vertical direction Y are referred to as a column of sub-pixels.

As shown in FIG. 1, the display panel 100 further includes a plurality of scanning signal lines GL(1) to GL(n) and a plurality of data signal lines DL(1) to DL(m). The plurality of scanning signal lines GL(1) to GL(n) and the plurality of data signal lines DL(1) to DL(m) all extend from the active area AA to the peripheral area S. For example, a scanning signal line GL extends in the horizontal direction X, and the scanning signal line GL is connected to a corresponding row of sub-pixels. A data signal line DL extends in the vertical direction Y, and the data signal line DL is connected to a corresponding column of sub-pixels.

As shown in FIG. 1, the display panel 100 further includes a gate drive circuit 10' disposed in the peripheral area S. The gate drive circuit 10' includes a plurality of shift register circuits RS(1) to RS(n). A shift register circuit RS is connected to a corresponding scanning signal line GL.

Figure 2:
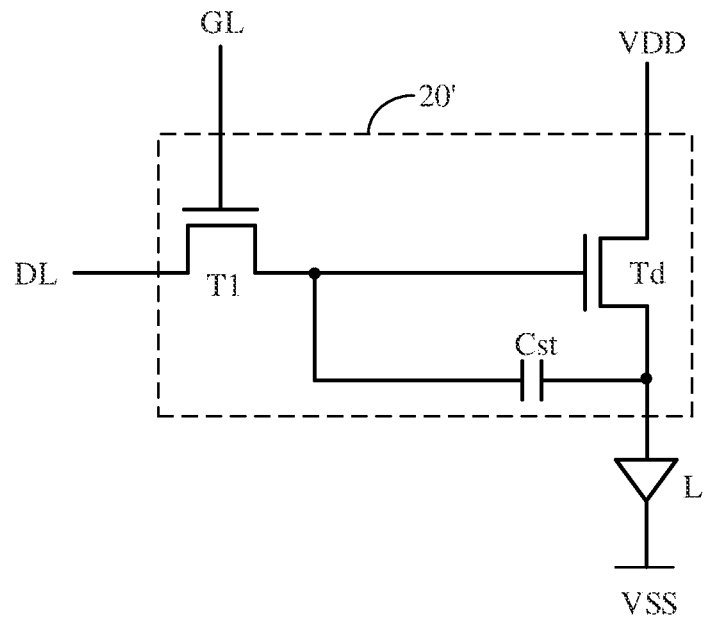
FIG. 2 is an equivalent circuit diagram of a pixel driving circuit in accordance with some embodiments.
Figure 3:
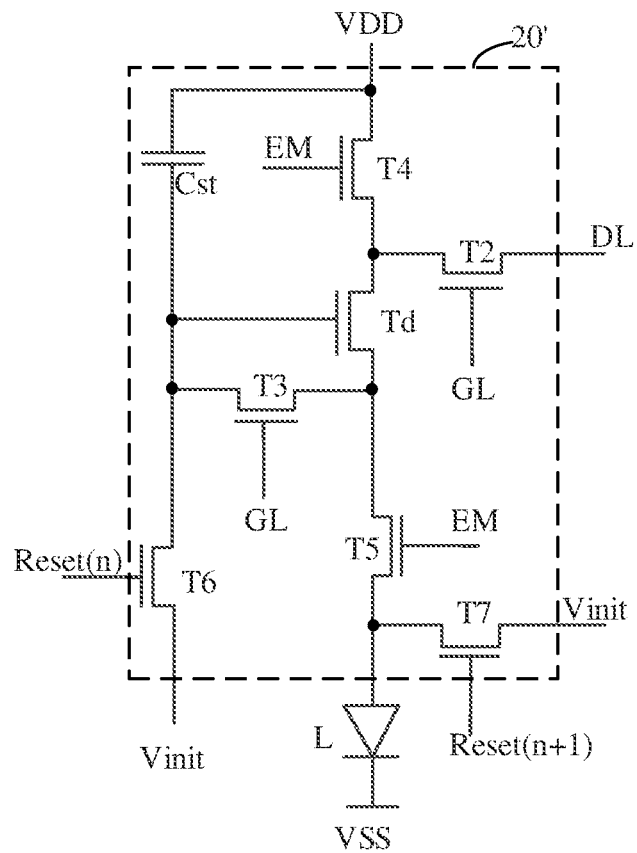
FIG. 3 is an equivalent circuit diagram of another pixel driving circuit in accordance with some embodiments.

As shown in FIGS. 1 to 3, a sub-pixel P includes a pixel driving circuit 20' and a light-emitting device L. The pixel driving circuit 20' is connected to the light-emitting device L, and the pixel driving circuit 20' is configured to drive the light-emitting device L to emit light.

In some examples, the light-emitting device L is a current-mode light-emitting diode. For example, the light-emitting device L is a micro light-emitting diode (Micro-LED), a mini light-emitting diode (Mini-LED), or an organic light-emitting diode (OLED).

In some examples, as shown in FIG. 2, the pixel driving circuit 20' includes a driving transistor Td, a first switching transistor T1 and a storage capacitor Cst. It will be understood by those skilled in the art that in the pixel driving circuit 20', a width-to-length ratio of a channel of the driving transistor Td is greater than width-to-length ratios of channels of other transistors that function as switches. That is, a circuit structure of the pixel driving circuit 20' is a 2T1C circuit structure.

As shown in FIG. 2, a gate of the first switching transistor T1 is electrically connected to a scanning signal line GL, a first electrode of the first switching transistor T1 is electrically connected to a data signal line DL, and a second electrode of the first switching transistor T1 is electrically connected to a gate of the driving transistor Td. A first electrode of the driving transistor Td is electrically connected to a first power line VDD, and a second electrode of the driving transistor Td is electrically connected to an anode of the light-emitting device L. A cathode of the light-emitting device L is electrically connected to a second power line VSS. One end of the storage capacitor Cst is electrically connected to the gate of the driving transistor Td, and the other end of the storage capacitor Cst is electrically connected to the second electrode of the driving transistor Td. For example, the first power line VDD is configured to provide a high voltage signal, and the second power line VSS is configured to provide a low voltage signal.

In some other examples, as shown in FIG. 3, the pixel driving circuit 20' includes a driving transistor Td, a second switching transistor T2, a third switching transistor T3, a fourth switching transistor T4, a fifth switching transistor T5, a sixth switching transistor T6, a seventh switching transistor T7 and a storage capacitor Cst. That is, the circuit structure of the pixel driving circuit 20' is a 7T1C circuit structure.

As shown in FIG. 3, a gate of the second switching transistor T2 is electrically connected to a scanning signal line GL, a first electrode of the second switching transistor T2 is electrically connected to a data signal line DL, and a second electrode of the second switching transistor T2 is electrically connected to a first electrode of the driving transistor Td. A gate of the third switching transistor T3 is electrically connected to a scanning signal terminal GL, a first electrode of the third switching transistor T3 is electrically connected to a second electrode of the driving transistor Td, and a second electrode of the third switching transistor T3 is electrically connected to a gate of the driving transistor Td. A gate of the fourth switching transistor T4 is electrically connected to an enable signal line EM, a first electrode of the fourth switching transistor T4 is electrically connected to a first power line VDD, and a second electrode of the fourth switching transistor T4 is electrically connected to the first electrode of the driving transistor Td. A gate of the fifth switching transistor T5 is electrically connected to an enable signal line EM, a first electrode of the fifth switching transistor T5 is electrically connected to the second electrode of the driving transistor Td, and a second electrode of the fifth switching transistor T5 is electrically connected to the anode of the light-emitting device L. A gate of the sixth switching transistor T6 is electrically connected to a reset signal line Reset(n), a first electrode of the sixth switching transistor T6 is electrically connected to an initialization signal line Vinit, and a second electrode of the sixth switching transistor T6 is electrically connected to the gate of the driving transistor Td. A gate of the seventh switching transistor T7 is electrically connected to a reset signal line Reset(n+1) which is connected to a sixth switching transistor T6 of a pixel driving circuit 20 in a next row, a first electrode of the seventh switching transistor T7 is electrically connected to an initialization signal line Vinit, and a second electrode of the seventh switching transistor T7 is electrically connected to the anode of the light-emitting device L. One end of the storage capacitor Cst is electrically connected to the gate of the driving transistor Td, and the other end of the storage capacitor Cst is electrically connected to the first power line VDD. A cathode of the light-emitting device L is electrically connected to a second power line VSS. For example, the first power line VDD is configured to provide a high voltage signal, and the second power line VSS is configured to provide a low voltage signal.

The above content is merely examples of the pixel driving circuit 20'. The circuit structure of the pixel driving circuit 20' is not limited to the two structures described above, and may be other types, which will not be listed herein. However, it will be understood that, regardless of the circuit structure the pixel driving circuit 20', it at least includes a driving transistor, a switching transistor functioning as a switch, and a storage capacitor.

Figure 4A:
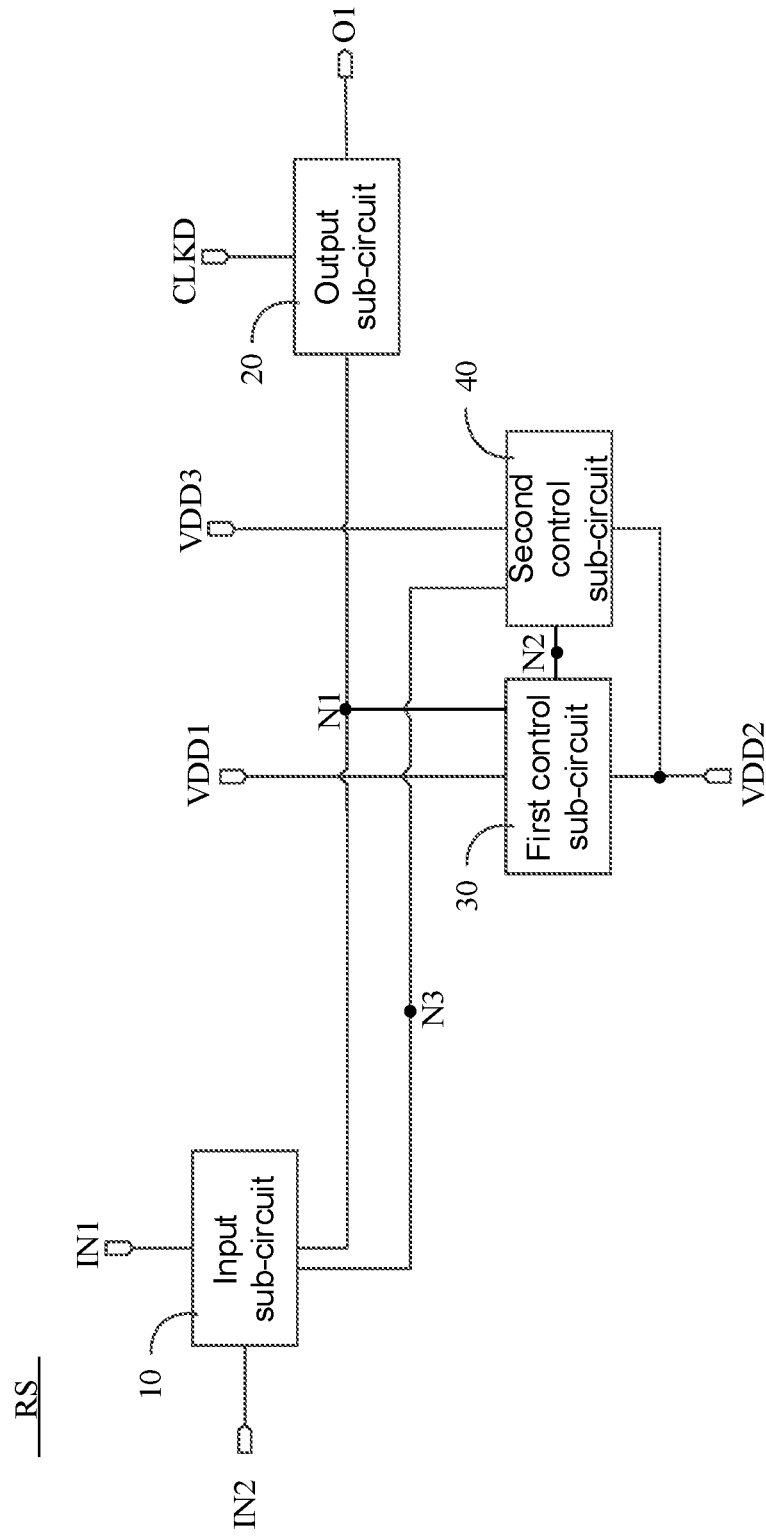
FIG. 4A is a block diagram showing a structure of a shift register circuit in accordance with some embodiments.
Figure 4B:
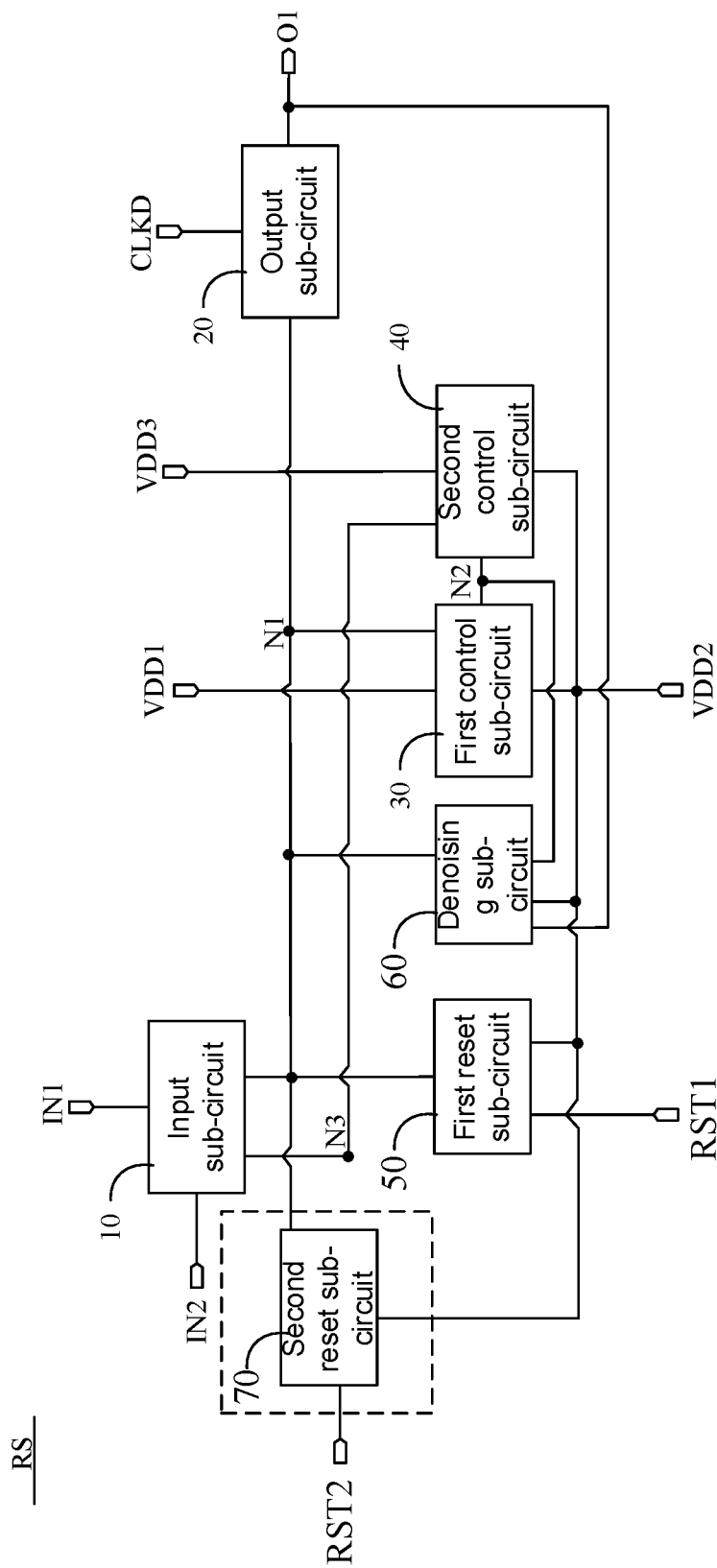
FIG. 4B is a block diagram showing a structure of another shift register circuit in accordance with some embodiments.

Some embodiments of the present disclosure provide a shift register circuit RS. As shown in FIGS. 4A and 4B, the shift register circuit RS includes an input sub-circuit 10, an output sub-circuit 20, a first control sub-circuit 30 and a second control sub-circuit 40.

The input sub-circuit 10 is connected to a first signal input terminal IN1, a second signal input terminal IN2 and a first node N1. The input sub-circuit 10 is configured to transmit a second input signal received from the second signal input terminal IN2 to the first node N1 in response to a first input signal received from the first signal input terminal IN1.

In some examples, the second signal input terminal IN2 and the first signal input terminal IN1 are the same signal input terminal. In this case, the second input signal is the same as the first input signal.

The output sub-circuit 20 is connected to the first node N1, a first clock signal terminal CLKD and a first output terminal O1. The output sub-circuit 20 is configured to store the second input signal at the first node N1, and transmit a first clock signal from the first clock signal terminal CLKD to the first output terminal O1 in response to the signal at the first node N1.

The first control sub-circuit 30 is connected to a first power supply voltage terminal VDD1, a second power supply voltage terminal VDD2, the first node N1 and a second node N2. The first control sub-circuit 30 is configured to transmit a first voltage signal to the second node N2 in response to the first voltage signal received from the first power supply voltage terminal VDD1, and transmit a second voltage signal of the second power supply voltage terminal VDD2 to the second node N2 in response to the signal at the first node N1.

Herein, one of the first voltage signal and the second voltage signal is a high voltage signal, and the other is a low voltage signal. "High" and "low" are relative concepts, and in the two voltage signals, the one with a higher voltage is referred to as a high voltage signal, and the one with a lower voltage is referred to as a low voltage signal. For example, the first voltage signal and the second voltage signal are both direct current voltage signals.

The second control sub-circuit 40 is connected to the second power supply voltage terminal VDD2, a third power supply voltage terminal VDD3, the second node N2 and a third node N3. The third node N3 is further connected to the input sub-circuit 10. The second control sub-circuit 40 is configured to transmit a third voltage signal to the third node N3 in response to the third voltage signal received from the third power supply voltage terminal VDD3, and disconnect the third power supply voltage terminal VDD3 from the third node N3 in response to the first voltage signal at the second node N2 and the second voltage signal from the second power supply voltage terminal VDD2.

Herein, the third voltage signal and the first voltage signal are both high voltage signals or both low voltage signals. In some examples, the first voltage signal, the second voltage signal and the third voltage signal are all direct current voltage signals. For example, the first power supply voltage terminal VDD1 and the third power supply voltage terminal VDD3 are the same power supply voltage terminal.

It will be understood by those skilled in the art that the transistor is a basic component of each sub-circuit, that is, in the embodiments of the present disclosure, each sub-circuit includes at least one transistor.

In some embodiments, the transistor is a depletion transistor. The depletion transistor is, for example, a depletion metal oxide semiconductor field effect transistors (MOSFETs) or a depletion oxide TFT. The embodiments of the present disclosure do not limit thereto.

Figure 5:
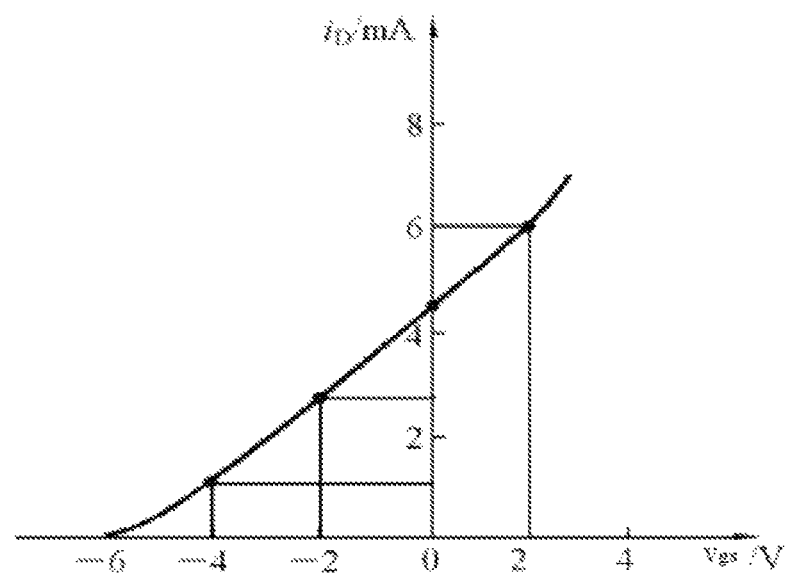
FIG. 5 is a characteristic curve diagram of a N-channel depletion transistor in accordance with some embodiments.

An N-channel depletion transistor is taken as an example. As shown in FIG. 5, in a case where a voltage difference $V_{gs}$ between a gate and a source of the depletion transistor is equal to 0, a drain current $i_D$ of the depletion transistor is greater than 0; in a case where $V_{gs}$ is equal to −6V, the drain current $i_D$ of the depletion transistor is equal to 0. It will be seen that in the case where $V_{gs}$ is equal to 0, the N-channel depletion transistor is still in turn-on state and cannot be turned off, and the drain current is relatively large. In a case where $i_D$ is equal to 0, the depletion transistor is turned off. In this case, $V_{gs}=-V_{th}$, where $V_{th}$ is a threshold voltage of the N-channel depletion transistor.

In the shift register circuit RS provided in the embodiments of the present disclosure, the input sub-circuit 10 transmits the second input signal from the second signal input terminal IN2 to the first node N1 in response to the first input signal received from the first signal input terminal IN1. The output sub-circuit 20 transmits the first clock signal from the first clock signal terminal CLKD to the first output terminal O1 in response to the second input signal at the first node N1. The first control sub-circuit 30 transmits the first voltage signal to the second node N2 in response to the first voltage signal received from the first power supply voltage terminal VDD1, and transmits the second voltage signal of the second power supply voltage terminal VDD2 to the second node N2 in response to the second input signal at the first node. That is, in a phase that the output sub-circuit 20 outputs the first clock signal (which is referred to as an output phase), the first control sub-circuit 30 transmits the second voltage signal of the second power supply voltage terminal VDD2 to the second node N2, and in other phase(s), the first control sub-circuit 30 transmits the first voltage signal to the second node N2. On this basis, in the output phase, the second control sub-circuit 40 transmits the third voltage signal to the third node N3 in response to the third voltage signal received from the third power supply voltage terminal VDD3. In other phase(s), the second control sub-circuit 40 disconnects the third power supply voltage terminal VDD3 from the third node N3 in response to the first voltage signal at the second node N2 and the second voltage signal of the second power supply voltage terminal VDD2, so that the third voltage signal does not transmitted to the third node N3. On this basis, since the third node N3 is further connected to the input sub-circuit 10, by reasonably setting the third voltage signal, it may be ensured that transistor(s) in the input sub-circuit 10 are completely turned off in a phase (which is in the output phase) in which the first output terminal O1 outputs an effective signal, thereby preventing the input sub-circuit 10 from generating a leakage current, and ensuring normal output of the shift register circuit RS.

Figure 6A:
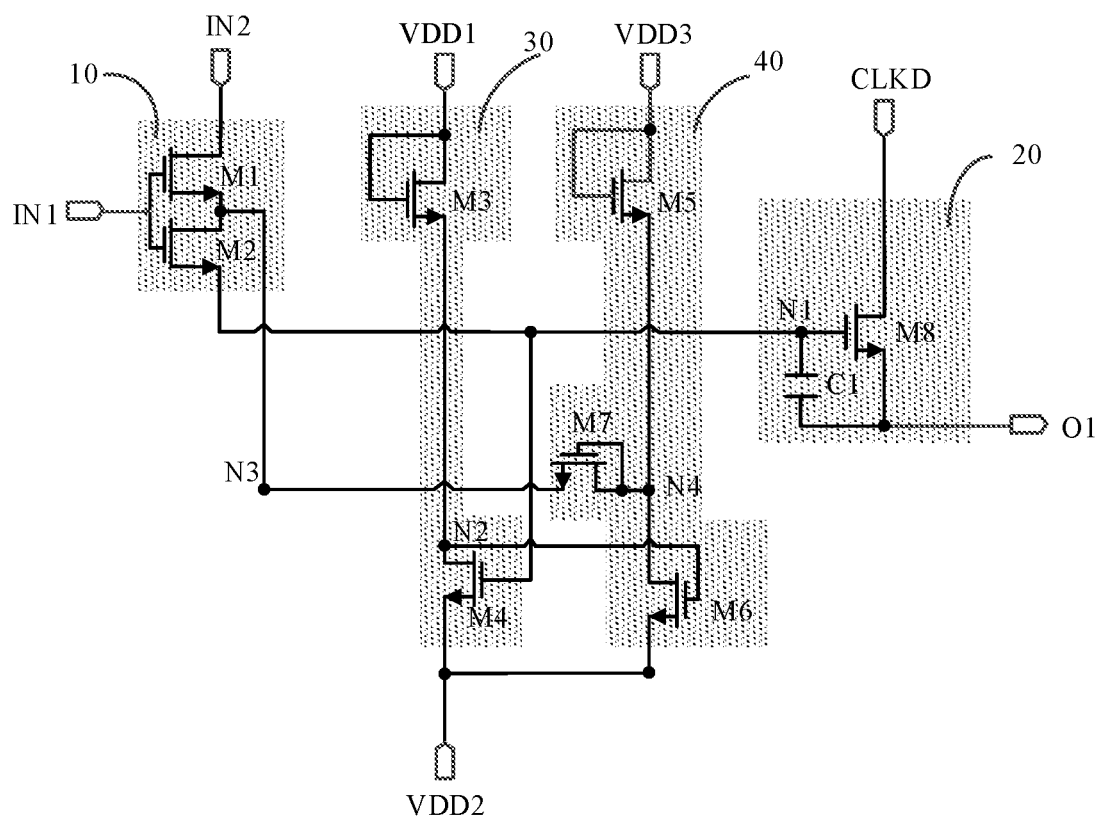
FIG. 6A is a structural diagram of a shift register circuit in accordance with some embodiments.
Figure 6B:
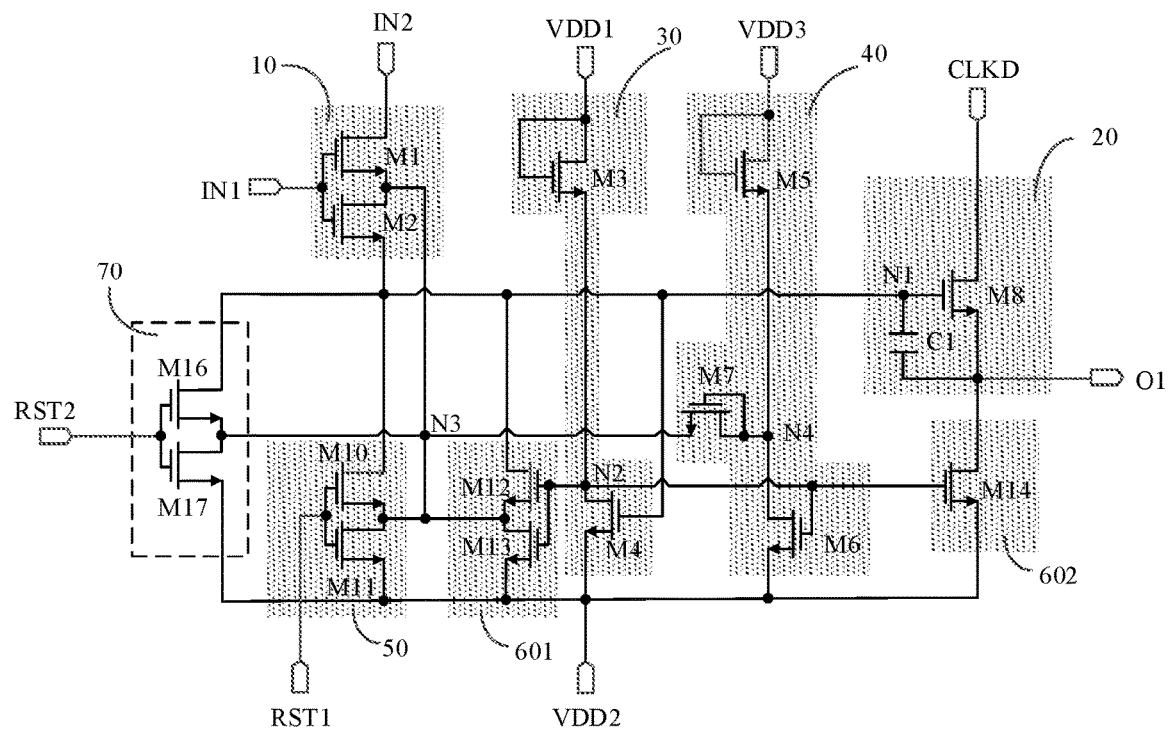
FIG. 6B is a structural diagram of another shift register circuit in accordance with some embodiments.

In some examples, as shown in FIGS. 6A and 6B, the input sub-circuit 10 includes a first transistor M1 and a second transistor M2. A gate of the first transistor M1 is connected to the first signal input terminal IN1, a first electrode of the first transistor M1 is connected to the second signal input terminal IN2, and a second electrode of the first transistor M1 is connected to a first electrode of the second transistor M2. A gate of the second transistor M2 is connected to the first signal input terminal IN1, and a second electrode of the second transistor M2 is connected to the first node N1. The first electrode of the second transistor M2 is further connected to the third node N3.

For example, the second signal input terminal IN2 and the first signal input terminal IN1 are the same signal terminal.

In some examples, as shown in FIGS. 6A and 6B, the first control sub-circuit 30 includes a third transistor M3 and a fourth transistor M4. A gate and a first electrode of the third transistor M3 are both connected to the first power supply voltage terminal VDD1, and a second electrode of the third transistor M3 is connected to the second node N2. A gate of the fourth transistor M4 is connected to the first node N1, a first electrode of the fourth transistor M4 is connected to the second node N2, and a second electrode of the fourth transistor M4 is connected to the second power supply voltage terminal VDD2. A width-to-length ratio of a channel of the fourth transistor M4 is greater than a width-to-length ratio of a channel of the third transistor M3.

In some examples, as shown in FIGS. 6A and 6B, the second control sub-circuit 40 includes a fifth transistor M5, a sixth transistor M6 and a seventh transistor M7. A gate and a first electrode of the fifth transistor M5 are both connected to the third power supply voltage terminal VDD3, and a second electrode of the fifth transistor M5 is connected to a fourth node N4. A gate of the sixth transistor M6 is connected to the second node N2, a first electrode of the sixth transistor M6 is connected to the fourth node N4, and a second electrode of the sixth transistor M6 is connected to the second power supply voltage terminal VDD2. A gate and a first electrode of the seventh transistor M7 are both connected to the fourth node N4, and a second electrode of the seventh transistor M7 is connected to the third node N3. A width-to-length ratio of a channel of the sixth transistor M6 is greater than a width-to-length ratio of a channel of the fifth transistor M5.

Since the first electrode of the second transistor M2 and the second electrode of the seventh transistor M7 are both connected to the third node N3, in order to ensure that a signal at the third node N3 is the third voltage signal from the third power supply voltage terminal VDD3 in a case where the seventh transistor M7 is turned on, there is a need to ensure that a width-to-length ratio of a channel of the seventh transistor M7 is greater than a width-to-length ratio of a channel of the first transistor M1 and a width-to-length ratio of a channel of the second transistor M2.

In some examples, as shown in FIGS. 6A and 6B, the output sub-circuit 20 includes an eighth transistor M8 and a capacitor C1. A gate of the eighth transistor M8 is connected to the first node N1, a first electrode of the eighth transistor M8 is connected to the first clock signal terminal CLKD, and a second electrode of the eighth transistor M8 is connected to the first output terminal O1. One end of the capacitor C1 is connected to the first node N1, and the other end of the capacitor is connected to the first output terminal O1.

In some examples, as shown in FIGS. 6A and 6B, the shift register circuit RS includes the first transistor M1, the second transistor M2, the third transistor M3, the fourth transistor M4, the fifth transistor M5, the sixth transistor M6, the seventh transistor M7, the eighth transistor M8 and the capacitor C1. The gate of the first transistor M1 is connected to the first signal input terminal IN1, the first electrode of the first transistor M1 is connected to the second signal input terminal IN2, and the second electrode of the first transistor M1 is connected to the first electrode of the second transistor M2. The first electrode of the second transistor M2 is further connected to the third node N3. The gate of the second transistor M2 is connected to the first signal input terminal IN1, and the second electrode of the second transistor M2 is connected to the first node N1. The gate and the first electrode of the third transistor M3 are both connected to the first power supply voltage terminal VDD1, and the second electrode of the third transistor M3 is connected to the second node N2. The gate of the fourth transistor M4 is connected to the first node N1, the first electrode of the fourth transistor M4 is connected to the second node N2, and the second electrode of the fourth transistor M4 is connected to the second power supply voltage terminal VDD2. The width-to-length ratio of the channel of the fourth transistor M4 is greater than the width-to-length ratio of the channel of the third transistor M3. The gate and the first electrode of the fifth transistor M5 are both connected to the third power supply voltage terminal VDD3, and the second electrode of the fifth transistor M5 is connected to the fourth node N4. The gate of the sixth transistor M6 is connected to the second node N2, the first electrode of the sixth transistor M6 is connected to the fourth node N4, and the second electrode of the sixth transistor M6 is connected to the second power supply voltage terminal VDD2. The gate and the first electrode of the seventh transistor M7 are both connected to the fourth node N4, and the second electrode of the seventh transistor M7 is connected to the third node N3. The width-to-length ratio of the channel of the sixth transistor M6 is greater than the width-to-length ratio of the channel of the fifth transistor M5. The width-to-length ratio of the channel of the seventh transistor M7 is greater than the width-to-length ratio of the channel of the first transistor M1 and the width-to-length ratio of the channel of the second transistor M2. The first electrode of the eighth transistor M8 is connected to the first clock signal terminal CLKD, and the second electrode of the eighth transistor M8 is connected to the first output terminal O1. One end of the capacitor C1 is connected to the first node N1, and the other end of the capacitor is connected to the first output terminal O1.

On this basis, for example, the first transistor M1, the second transistor M2, the third transistor M3, the fourth transistor M4, the fifth transistor M5, the sixth transistor M6, the seventh transistor M7 and the eighth transistor M8 are all N-type transistors.

Figure 11A:
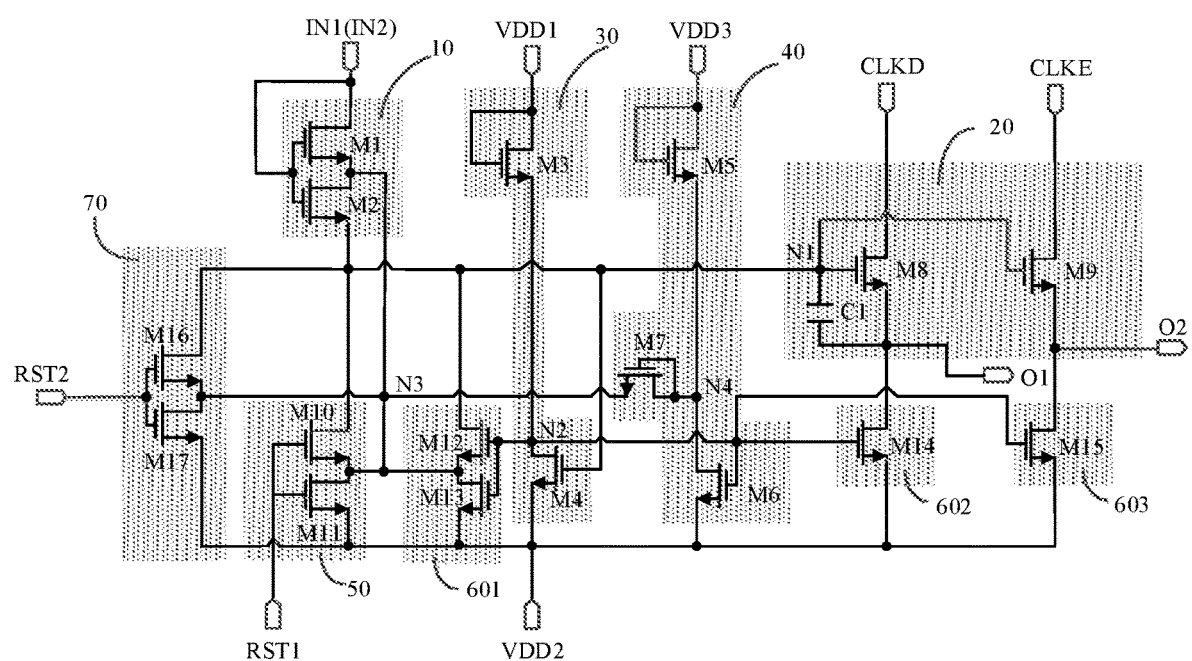
FIG. 11A is a structural diagram of another shift register circuit in accordance with some embodiments.
Figure 11B:
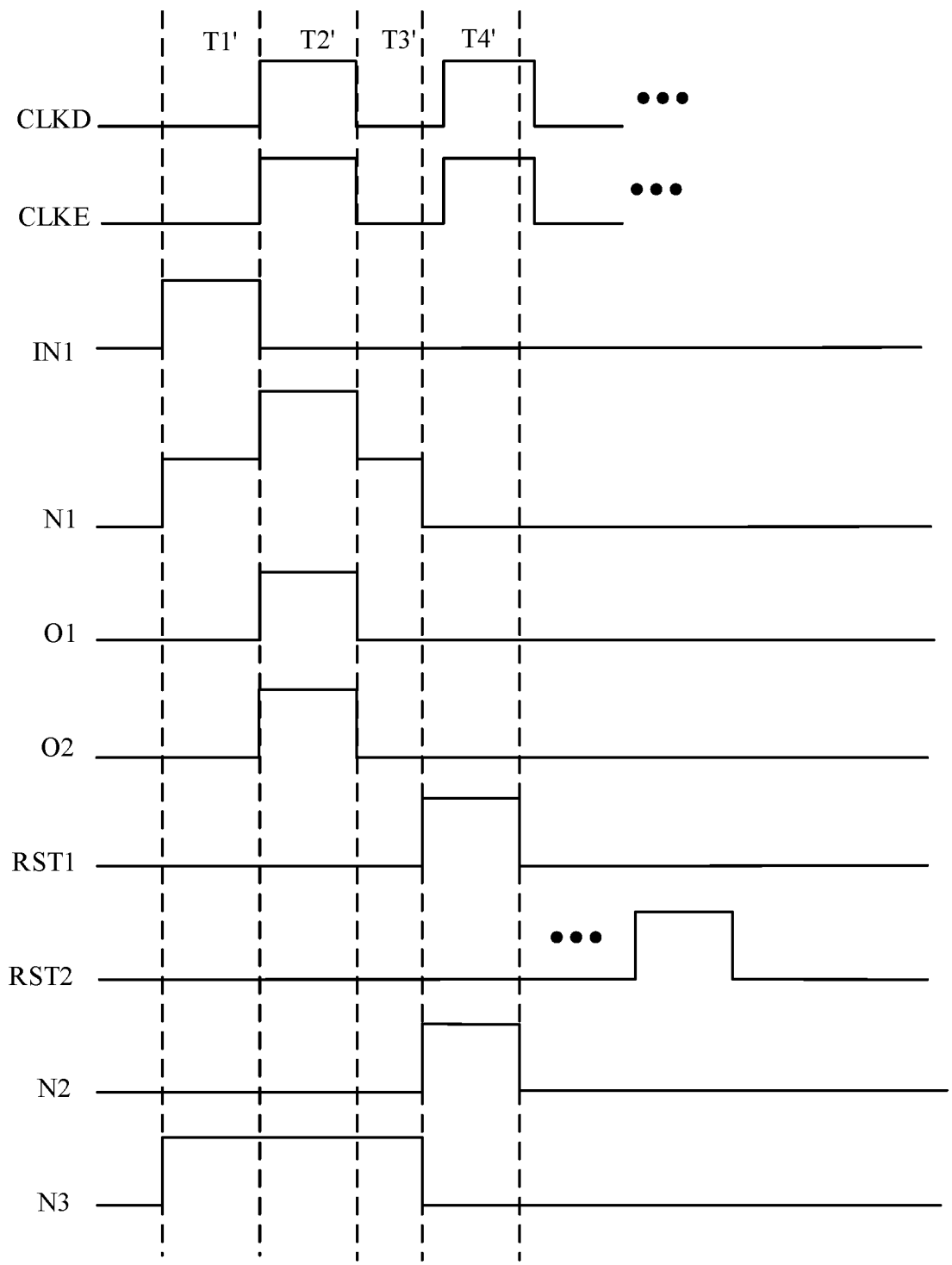
FIG. 11B is a working timing diagram of a third-stage shift register circuit of the gate drive circuit in accordance with some embodiments.

On this basis, referring to FIG. 11B, in a first phase T1':

The first input signal from the first signal input terminal IN1 is a high voltage signal in the first phase T1', and the first transistor M1 and the second transistor M2 are turned on. The second input signal is transmitted to the first node N1 through the turned-on first transistor M1 and the second transistor M2, and the capacitor C1 is charged.

Since a voltage of the first node N1 is a high voltage, the eighth transistor M8 is turned on. The first clock signal from the first clock signal terminal CLKD is a low voltage signal in the first phase T1', and the first clock signal is transmitted to the first output terminal O1 through the turned-on eighth transistor M8. In the first phase, the first output terminal O1 outputs a low voltage signal.

The first voltage signal from the first power supply voltage terminal VDD1 is a high voltage signal, and the third transistor M3 is turned on. The voltage at the first node N1 is a high voltage, and the fourth transistor M4 is turned on. Since the width-to-length ratio of the channel of the fourth transistor M4 is greater than the width-to-length ratio of the channel of the third transistor M3, the second voltage signal of the second power supply voltage terminal VDD2 is transmitted to the second node N2 through the turned-on fourth transistor M4, and the voltage at the second node N2 is a low voltage. The voltage at the second node N2 is a low voltage, and the sixth transistor M6 is in a turn-off state.

The third voltage signal from the third power supply voltage terminal VDD3 is a high voltage signal, and the fifth transistor M5 is turned on. Since the sixth transistor M6 is in the turn-off state, the seventh transistor is turned on. The width-to-length ratio of the channel of the seventh transistor M7 is greater than the width-to-length ratio of the channel of the first transistor M1 and the width-to-length ratio of the channel of the second transistor M2, the third voltage signal is transmitted to the fourth node N4 through the turned-on fifth transistor M5, and is transmitted to the third node N3 from the fourth node N4 through the turned-on seventh transistor M7. That is, in the first phase, the voltage at the third node N3 is a high voltage.

In a second phase T2':

The eighth transistor M8 is still in the turn-on state. The first input signal is a low voltage signal in the second phase T2', and the first transistor M1 and the second transistor M2 are turned off. The first clock signal is a high voltage signal in the second phase T2', the first clock signal is transmitted to the first output terminal O1 through the turned-on eighth transistor M8. That is, the first output terminal O1 outputs a high voltage signal in the second phase.

Since one end of the capacitor C1 is connected to the first node N1, and the other end of the capacitor C1 is connected to the first output terminal O1, in the second phase T2', the voltage at the first node N1 raises based on the voltage at the first node N1 in the first phase T1' through the coupling effect and bootstrap effect the capacitor C1.

In this case, the fourth transistor M4 maintains the turn-on state, and the sixth transistor M6 maintains the turn-off state. The voltage at the third node N3 is still a high voltage.

The first electrode of the second transistor M2 is connected to the third node N3. Herein, if the second transistor M2 is not turned off, the voltage at the first node N1 may leak through the second transistor M2. In this case, the first electrode of the second transistor M2 serves as the second electrode thereof, and the second electrode of the second transistor M2 serves as the first electrode thereof. Since the voltage of the first input signal in the first phase is constant, the gate-source voltage difference of the second transistor M2 is reduced, and the second transistor M2 is completely turned off. In this way, the voltage at the first node N1 may be prevented from leaking through the second transistor M2, and the normal output of the shift register circuit RS is ensured.

In a third phase T3':

The eighth transistor M8 maintains the turn-on state. The first clock signal is a low voltage signal in the third phase, and the first clock signal is transmitted to the first output terminal O1 through the turned-on eighth transistor M8. That is, the first output terminal O1 outputs a low voltage signal.

In the third phase T3', the voltage at the first node N1 drops to the voltage at the first node N1 in the first phase T1'. Other transistors maintain the state in the second phase T2'.

The first phase T1', the second phase T2' and the third phase T3' all belong to the output phase.

Figure 7A:
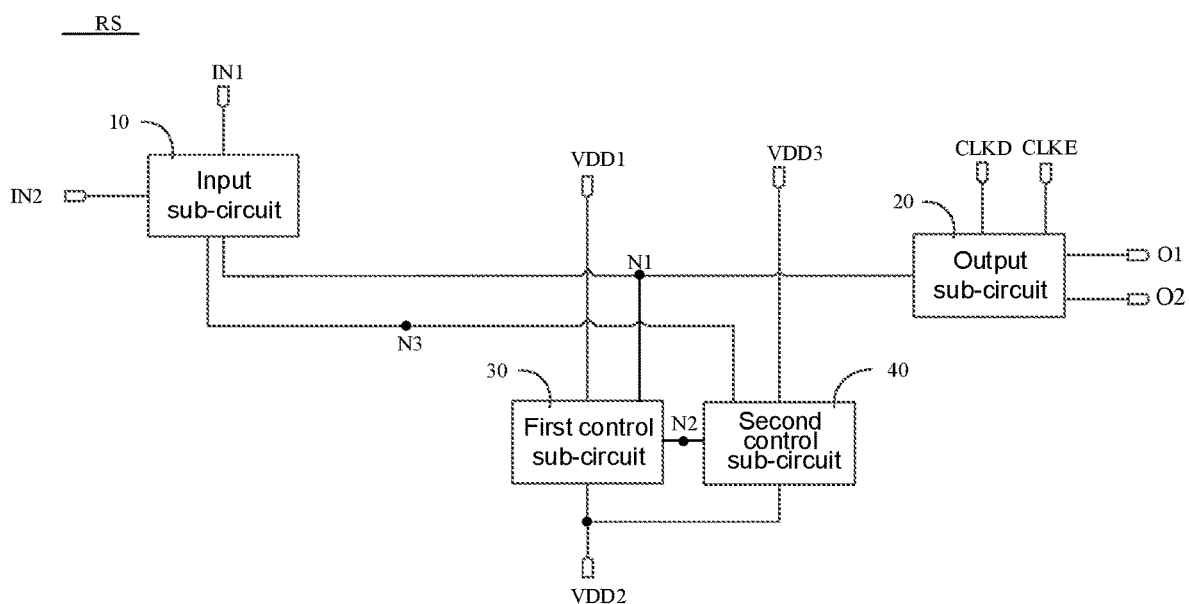
FIG. 7A is a block diagram showing a structure of another shift register circuit in accordance with some embodiments.
Figure 7B:
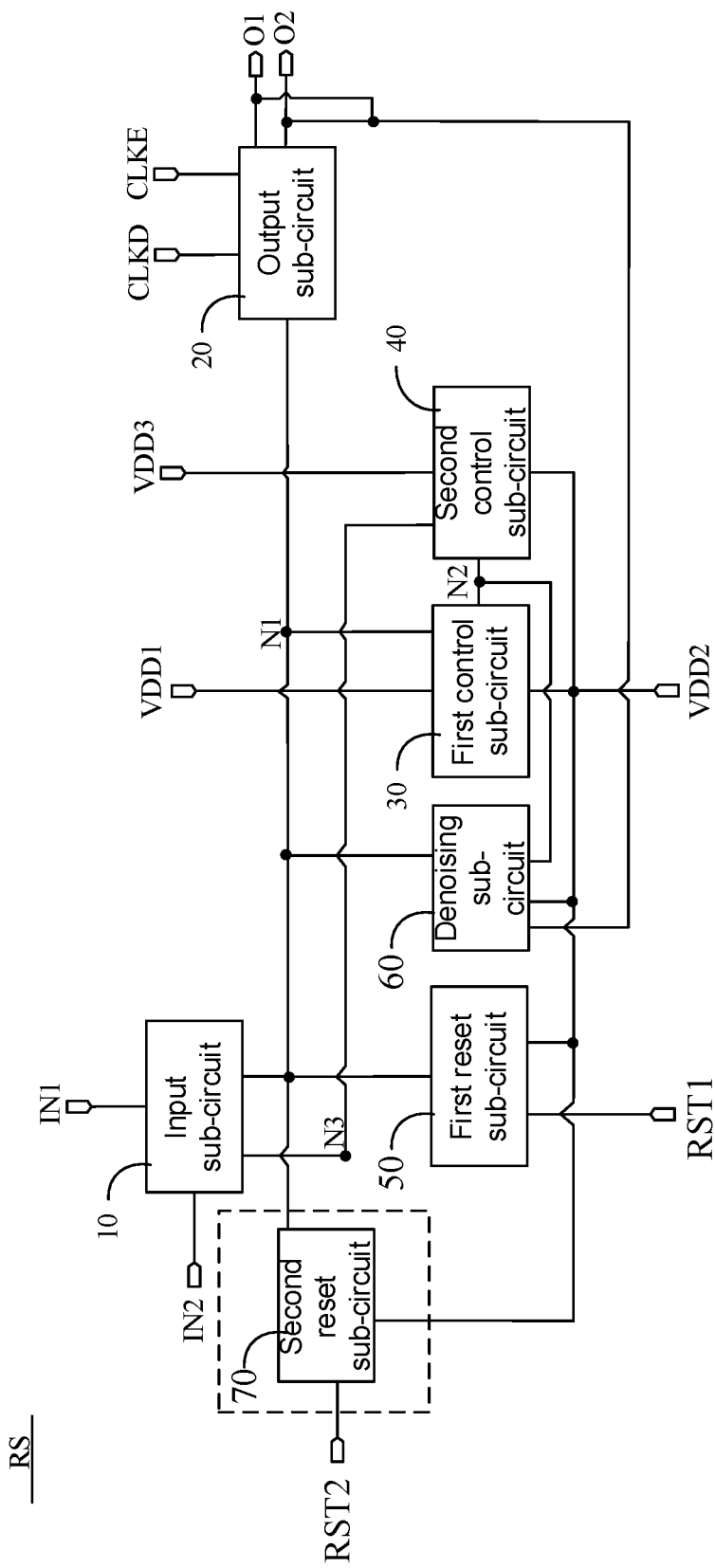
FIG. 7B is a block diagram showing a structure of another shift register circuit in accordance with some embodiments.

In some embodiments, as shown in FIGS. 7A and 7B, the output sub-circuit 20 is further connected to a second clock signal terminal CLKE and a second output terminal O2. The output sub-circuit 20 is further configured to transmit a second clock signal of the second clock signal terminal CLKE to the second output terminal O2 in response to the second input signal at the first node N1.

In some examples, the first clock signal output by the first output terminal O1 is output to another shift register circuit, and the second clock signal output by the second output terminal O2 is output as a scanning signal to a scanning signal line GL.

It will be noted that, as described above, in a phase in which the first output terminal O1 outputs an effective signal (i.e., the second phase), the signal at the first node N1 jumps due to the bootstrap effect of the capacitor C1. However, this jump does not affect the state of the transistors, that is, the transistors that are in the turn-on state in the first phase maintain the turn-on state in the second phase, and the transistors that are in the turn-off state in the first phase maintain the turn-off state in the second phase. That is, in the first phase to the third phase, sub-circuits controlled by the signal at the first node N1 are controlled by the second input signal transmitted to the first node N1.

Figure 8A:
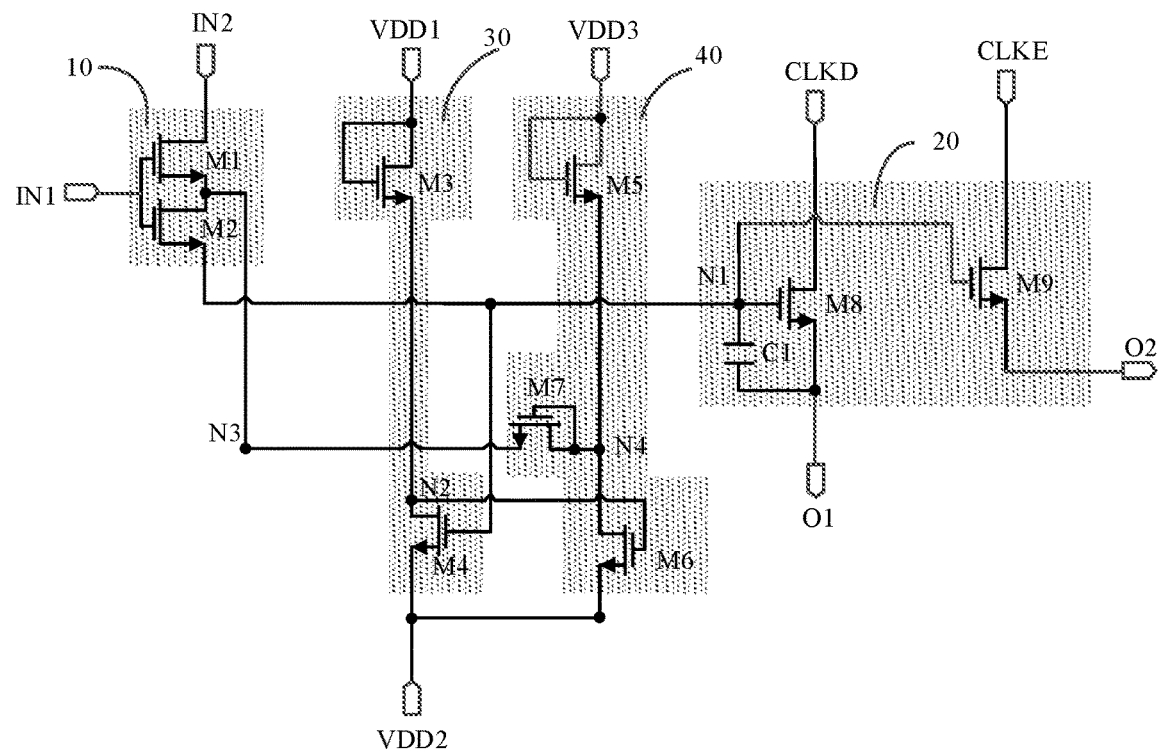
FIG. 8A is a structural diagram of another shift register circuit in accordance with some embodiments.
Figure 8B:
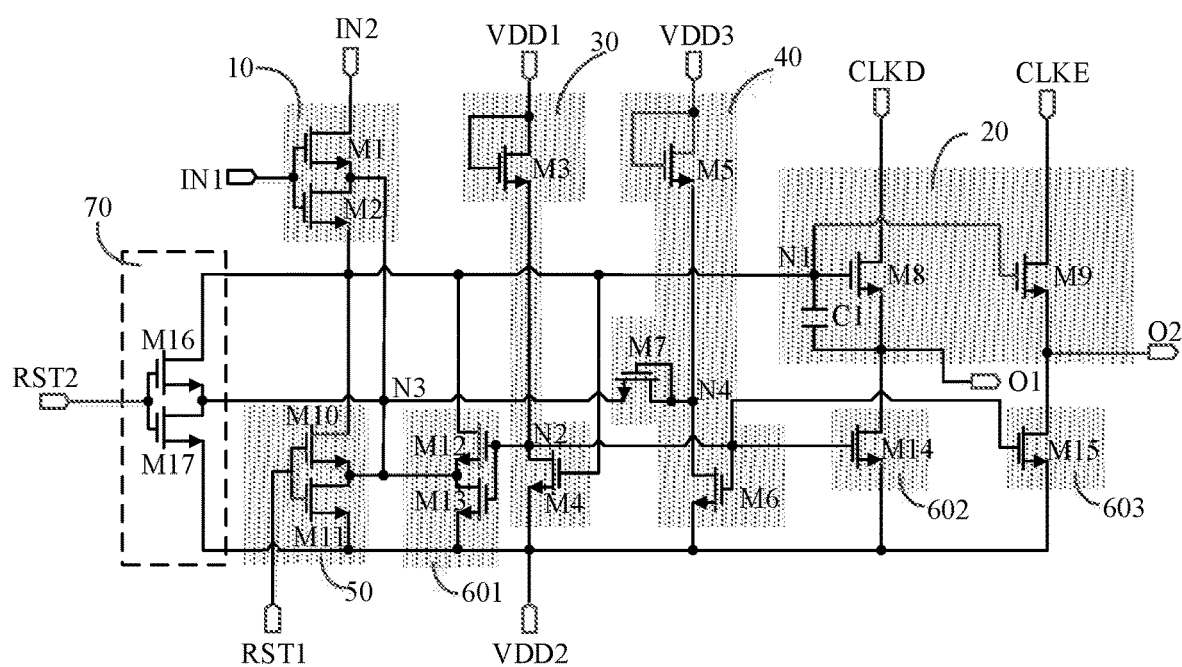
FIG. 8B is a structural diagram of another shift register circuit in accordance with some embodiments.

In some examples, as shown in FIGS. 8A and 8B, the output sub-circuit 20 includes an eighth transistor M8, a ninth transistor M9 and a capacitor C1. A gate of the eighth transistor M8 is connected to the first node N1, a first electrode of the eighth transistor M8 is connected to the first clock signal terminal CLKD, and a second electrode of the eighth transistor M8 is connected to the first output terminal O1. A gate of the ninth transistor M9 is connected to the first node N1, a first electrode of the ninth transistor M9 is connected to the second clock signal terminal CLKE, and a second electrode of the ninth transistor M9 is connected to the second output terminal O2. One end of the capacitor C1 is connected to the first node N1, and the other end of the capacitor is connected to the first output terminal O1.

In some examples, as shown in FIGS. 8A and 8B, the shift register circuit RS includes the first transistor M1, the second transistor M2, the third transistor M3, the fourth transistor M4, the fifth transistor M5, the sixth transistor M6, the seventh transistor M7, the eighth transistor M8, the ninth transistor M9 and the capacitor C1.

The gate of the first transistor M1 is connected to the first signal input terminal IN1, the first electrode of the first transistor M1 is connected to the second signal input terminal IN2, and the second electrode of the first transistor M1 is connected to the first electrode of the second transistor M2. The gate of the second transistor M2 is connected to the first signal input terminal IN1, and the second electrode of the second transistor M2 is connected to the first node N1. The first electrode of the second transistor M2 is also connected to the third node N3. The gate and the first electrode of the third transistor M3 are both connected to the first power supply voltage terminal VDD1, and the second electrode of the third transistor M3 is connected to the second node N2. The gate of the fourth transistor M4 is connected to the first node N1, the first electrode of the fourth transistor M4 is connected to the second node N2, and the second electrode of the fourth transistor M4 is connected to the second power supply voltage terminal VDD2. The width-to-length ratio of the channel of the fourth transistor M4 is greater than the width-to-length ratio of the channel of the third transistor M3. The gate and the first electrode of the fifth transistor M5 are both connected to the third power supply voltage terminal VDD3, and the second electrode of the fifth transistor M5 is connected to the fourth node N4. The gate of the sixth transistor M6 is connected to the second node N2, the first electrode of the sixth transistor M6 is connected to the fourth node N4, and the second electrode of the sixth transistor M6 is connected to the second power supply voltage terminal VDD2. The gate and the first electrode of the seventh transistor M7 are both connected to the fourth node N4, and the second electrode of the seventh transistor M7 is connected to the third node N3. The width-to-length ratio of the channel of the sixth transistor M6 is greater than the width-to-length ratio of the channel of the fifth transistor M5. The width-to-length ratio of the channel of the seventh transistor M7 is greater than the width-to-length ratio of the channel of the first transistor M1 and the width-to-length ratio of the channel of the second transistor M2. The first electrode of the eighth transistor M8 is connected to the first clock signal terminal CLKD, and the second electrode of the eighth transistor M8 is connected to the first output terminal O1. One end of the capacitor C1 is connected to the first node N1, and the other end of the capacitor is connected to the first output terminal O1. The gate of the ninth transistor M9 is connected to the first node N1, the first electrode of the ninth transistor M9 is connected to the second clock signal terminal CLKE, and the second electrode of the ninth transistor M9 is connected to the second output terminal O2.

On this basis, for example, the first transistor M1, the second transistor M2, the third transistor M3, the fourth transistor M4, the fifth transistor M5, the sixth transistor M6, the seventh transistor M7, the eighth transistor M8 and the ninth transistor M9 are all N-type transistors.

In some embodiments, as shown in FIGS. 4B and 7B, the shift register circuit RS further includes a first reset sub-circuit 50. The first reset sub-circuit 50 is connected to a first reset signal terminal RST1, the first node N1 and the second power supply voltage terminal VDD2. The first reset sub-circuit 50 is configured to transmit the second voltage signal from the second power supply voltage terminal VDD2 to the first node N1 in response to the first reset signal received from the first reset signal terminal RST1, so as to reset the first node N1.

In some examples, as shown in FIGS. 6B and 8B, the first reset sub-circuit 50 includes a tenth transistor M10 and an eleventh transistor M11. A gate of the tenth transistor M10 is connected to the first reset signal terminal RST1, a first electrode of the tenth transistor M10 is connected to the first node N1, and a second electrode of the tenth transistor M10 is connected to a first electrode of the eleventh transistor M11. A gate of the eleventh transistor M11 is connected to the first reset signal terminal RST1, the second electrode of the eleventh transistor M11 is connected to the second power supply voltage terminal VDD2.

In some examples, the second electrode of the tenth transistor M10 is further connected to the third node N3.

For example, as shown in FIG. 8B, the shift register circuit RS includes the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11 and the capacitor C1.

The gate of the first transistor M1 is connected to the first signal input terminal IN1, the first electrode of the first transistor M1 is connected to the second signal input terminal IN2, and the second electrode of the first transistor M1 is connected to the first electrode of the second transistor M2. The gate of the second transistor M2 is connected to the first signal input terminal IN1, and the second electrode of the second transistor M2 is connected to the first node N1. The first electrode of the second transistor M2 is also connected to the third node N3. The gate and the first electrode of the third transistor M3 are both connected to the first power supply voltage terminal VDD1, and the second electrode of the third transistor M3 is connected to the second node N2. The gate of the fourth transistor M4 is connected to the first node N1, the first electrode of the fourth transistor M4 is connected to the second node N2, and the second electrode of the fourth transistor M4 is connected to the second power supply voltage terminal VDD2. The width-to-length ratio of the channel of the fourth transistor M4 is greater than the width-to-length ratio of the channel of the third transistor M3. The gate and the first electrode of the fifth transistor M5 are both connected to the third power supply voltage terminal VDD3, and the second electrode of the fifth transistor M5 is connected to the fourth node N4. The gate of the sixth transistor M6 is connected to the second node N2, the first electrode of the sixth transistor M6 is connected to the fourth node N4, and the second electrode of the sixth transistor M6 is connected to the second power supply voltage terminal VDD2. The gate and the first electrode of the seventh transistor M7 are both connected to the fourth node N4, and the second electrode of the seventh transistor M7 is connected to the third node N3. The width-to-length ratio of the channel of the sixth transistor M6 is greater than the width-to-length ratio of the channel of the fifth transistor M5. The width-to-length ratio of the channel of the seventh transistor M7 is greater than the width-to-length ratio of the channel of the first transistor M1 and the width-to-length ratio of the channel of the second transistor M2. The first electrode of the eighth transistor M8 is connected to the first clock signal terminal CLKD, and the second electrode of the eighth transistor M8 is connected to the first output terminal O1. One end of the capacitor C1 is connected to the first node N1, and the other end of the capacitor is connected to the first output terminal O1. The gate of the ninth transistor M9 is connected to the first node N1, the first electrode of the ninth transistor M9 is connected to the second clock signal terminal CLKE, and the second electrode of the ninth transistor M9 is connected to the second output terminal O2. The gate of the tenth transistor M10 is connected to the first reset signal terminal RST1, the first electrode of the tenth transistor M10 is connected to the first node N1, and the second electrode of the tenth transistor M10 is connected to the first electrode of the eleventh transistor M11. The second electrode of the tenth transistor M10 is further connected to the third node N3. The gate of the eleventh transistor M11 is connected to the first reset signal terminal RST1, and the second electrode of the eleventh transistor M11 is connected to the second power supply voltage terminal VDD2.

The first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10 and the eleventh transistor M11 are all the N-type transistors.

In some embodiments, as shown in FIGS. 4B and 7B, the shift register circuit RS further includes a denoising sub-circuit 60. The denoising sub-circuit 60 is connected to the first node N1, the second node N2, the first output terminal O1 and the second power supply voltage terminal VDD2. The denoising sub-circuit 60 is configured to transmit the second voltage signal to the first node N1 and the first output terminal O1 in response to the first voltage signal at the second node N2, so as to reduce noise on the first node N1 and the first output terminal O1.

Figure 9:
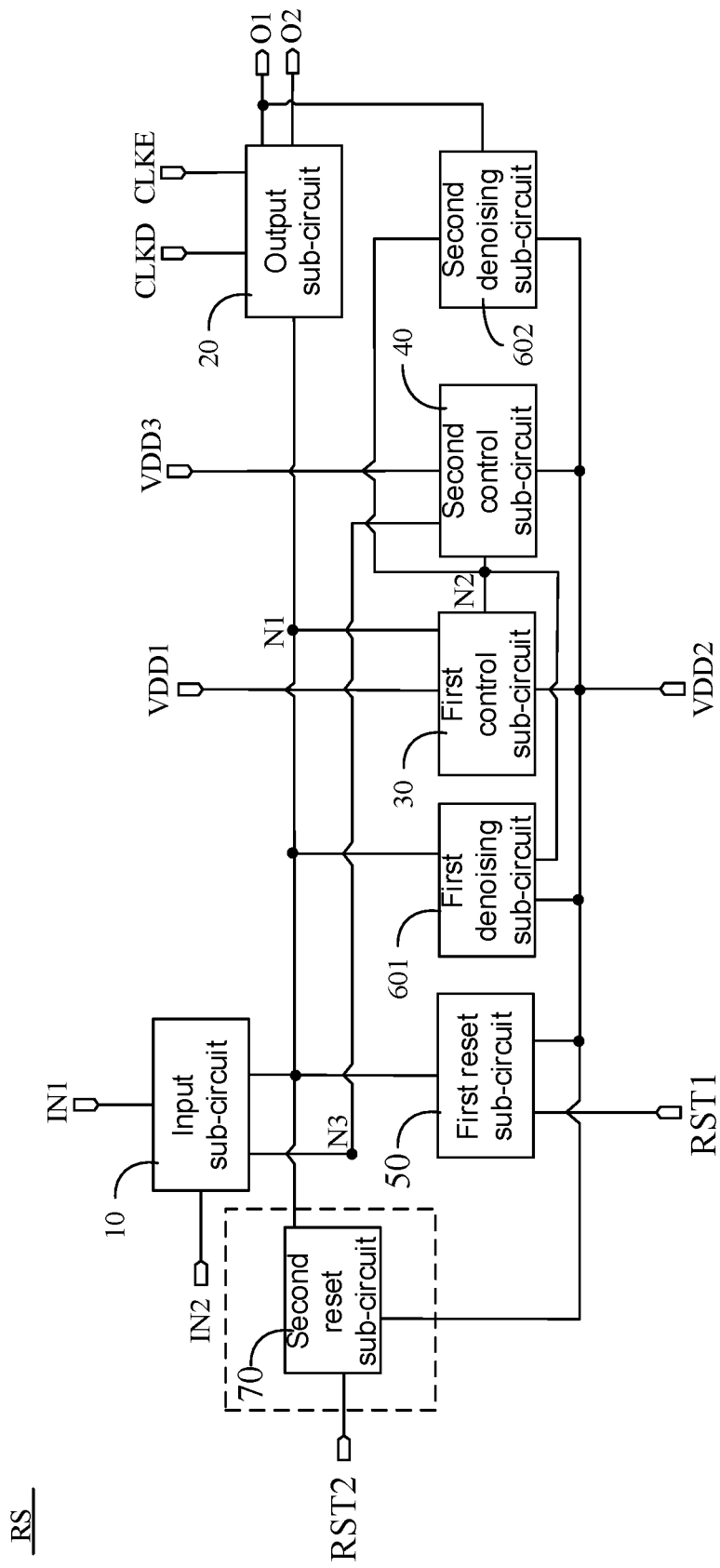
FIG. 9 is a block diagram showing a structure of another shift register circuit in accordance with some embodiments.
Figure 10:
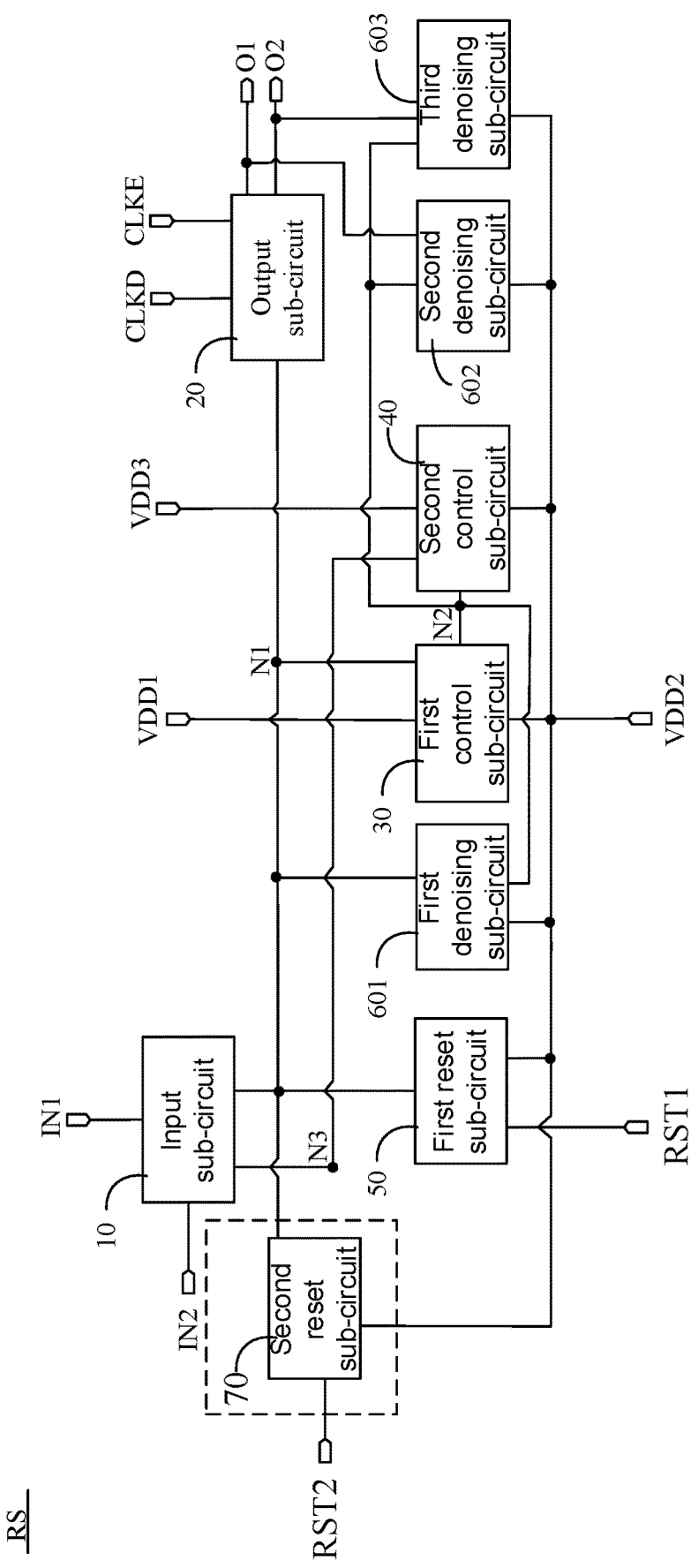
FIG. 10 is a block diagram showing a structure of another shift register circuit in accordance with some embodiments.

In some embodiments, as shown in FIGS. 9 and 10, the denoising sub-circuit 60 includes a first denoising sub-circuit 601 and a second denoising sub-circuit 602. The first denoising sub-circuit 601 is connected to the first node N1, the second node N2 and the second power supply voltage terminal VDD2. The first denoising sub-circuit 601 is configured to transmit the second voltage signal to the first node N1 in response to the first voltage signal at the second node N2. The second denoising sub-circuit 602 is connected to the second node N2, the first output terminal O1 and the second power supply voltage terminal VDD2. The second denoising sub-circuit 602 is configured to transmit the second voltage signal to the first output terminal O1 in response to the first voltage signal at the second node N2.

In some examples, as shown in FIGS. 6B and 8B, the first denoising sub-circuit 601 includes a twelfth transistor M12 and a thirteenth transistor M13. A gate of the twelfth transistor M12 is connected to the second node N2, a first electrode of the twelfth transistor M12 is connected to the first node N1, and a second electrode of the twelfth transistor M12 is connected to a first electrode of the thirteenth transistor M13. The second electrode of the twelfth transistor M12 is further connected to the third node N3. A gate of the thirteenth transistor M13 is connected to the second node N2, and a second electrode of the thirteenth transistor M13 is connected to the second power supply voltage terminal VDD2.

In some examples, as shown in FIGS. 6B and 8B, the second denoising sub-circuit 602 includes a fourteenth transistor M14. A gate of the fourteenth transistor M14 is connected to the second node N2, a first electrode of the fourteenth transistor M14 is connected to the first output terminal O1, and a second electrode of the fourteenth transistor M14 is connected to the second power supply voltage terminal VDD2.

In some embodiments, as shown in FIG. 10, the denoising sub-circuit 60 further includes a third denoising sub-circuit 603. The third denoising sub-circuit 603 is connected to the second node N2, the second output terminal O2, and the second power supply voltage terminal VDD2. The third denoising sub-circuit 603 is configured to transmit the second voltage signal to the second output terminal O2 in response to the first voltage signal at the second node N2.

In some examples, as shown in FIG. 8B, the third denoising sub-circuit 603 includes a fifteenth transistor M15. A gate of the fifteenth transistor M15 is connected to the second node N2, a first electrode of the fifteenth transistor M15 is connected to the second output terminal O2, and a second electrode of the fifteenth transistor M15 is connected to the second power supply voltage terminal VDD2.

For example, as shown in FIG. 8B, the shift register circuit RS includes the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13, the fourteenth transistor M14, the fifteenth transistor M15 and the capacitor C1.

The second electrode of the first transistor M1 is connected to the first electrode of the second transistor M2. The gate of the second transistor M2 is connected to the first signal input terminal IN1, the second electrode of the second transistor M2 is connected to the first node N1, and the first electrode of the second transistor M2 is further connected to the third node N3. The gate and the first electrode of the third transistor M3 are both connected to the first power supply voltage terminal VDD1, and the second electrode of the third transistor M3 is connected to the second node N2. The gate of the fourth transistor M4 is connected to the first node N1, the first electrode of the fourth transistor M4 is connected to the second node N2, and the second electrode of the fourth transistor M4 is connected to the second power supply voltage terminal VDD2. The width-to-length ratio of the channel of the fourth transistor M4 is greater than the width-to-length ratio of the channel of the third transistor M3. The gate and the first electrode of the fifth transistor M5 are both connected to the third power supply voltage terminal VDD3, and the second electrode of the fifth transistor M5 is connected to the fourth node N4. The gate of the sixth transistor M6 is connected to the second node N2, the first electrode of the sixth transistor M6 is connected to the fourth node N4, and the second electrode of the sixth transistor M6 is connected to the second power supply voltage terminal VDD2. The gate and the first electrode of the seventh transistor M7 are both connected to the fourth node N4, and the second electrode of the seventh transistor M7 is connected to the third node N3. The width-to-length ratio of the channel of the sixth transistor M6 is greater than the width-to-length ratio of the channel of the fifth transistor M5. The second electrode of the first transistor M1 is further connected to the third node N3. The width-to-length ratio of the channel of the seventh transistor M7 is greater than the width-to-length ratio of the channel of the first transistor M1 and the width-to-length ratio of the channel of the second transistor M2. The first electrode of the eighth transistor M8 is connected to the first clock signal terminal CLKD, and the second electrode of the eighth transistor M8 is connected to the first output terminal O1. One end of the capacitor C1 is connected to the first node N1, and the other end of the capacitor is connected to the first output terminal O1. The gate of the ninth transistor M9 is connected to the first node N1, the first electrode of the ninth transistor M9 is connected to the second clock signal terminal CLKE, and the second electrode of the ninth transistor M9 is connected to the second output terminal O2. The gate of the tenth transistor M10 is connected to the first reset signal terminal RST1, the first electrode of the tenth transistor M10 is connected to the first node N1, and the second electrode of the tenth transistor M10 is connected to the first electrode of the eleventh transistor M11. The gate of the eleventh transistor M11 is connected to the first reset signal terminal RST1, and the second electrode of the eleventh transistor M11 is connected to the second power supply voltage terminal VDD2. The gate of the twelfth transistor M12 is connected to the second node N2, the first electrode of the twelfth transistor M12 is connected to the first node N1, and the second electrode of the twelfth transistor M12 is connected to the first electrode of the thirteenth transistor M13. The gate of the thirteenth transistor M13 is connected to the second node N2, and the second electrode of the thirteenth transistor M13 is connected to the second power supply voltage terminal VDD2. The gate of the fourteenth transistor M14 is connected to the second node N2, the first electrode of the fourteenth transistor M14 is connected to the first output terminal O1, and the second electrode of the fourteenth transistor M14 is connected to the second power supply voltage terminal VDD2. The gate of the fifteenth transistor M15 is connected to the second node N2, the first electrode of the fifteenth transistor M15 is connected to the second output terminal O2, and the second electrode of the fifteenth transistor M15 is connected to the second power supply voltage terminal VDD2. The second electrode of the tenth transistor M10 and the second electrode of the twelfth transistor M12 are further connected to the third node N3.

On this basis, for example, the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13, the fourteenth transistor M14 and the fifteenth transistor M15 are all the N-type transistors.

In some embodiments, as shown in FIGS. 4B, 7B, 9 and 10, the shift register circuit RS further includes a second reset sub-circuit 70. The second reset sub-circuit 70 is connected to a second reset signal terminal RST2, the first node N1 and the second power supply voltage terminal VDD2. The second reset sub-circuit 70 is configured to transmit the second voltage signal to the first node N1 in response to a second reset signal received from the second reset signal terminal RST2, so as to reset the first node N1.

In some examples, as shown in FIGS. 6B and 8B, the second reset control sub-circuit 70 includes a sixteenth transistor M16 and a seventeenth transistor M17. A gate of the sixteenth transistor M16 is connected to the second reset signal terminal RST2, a first electrode of the sixteenth transistor M16 is connected to the first node N1, and a second electrode of the sixteenth transistor M16 is connected to a first electrode of the seventeenth transistor M17 and the third node N3. A gate of the seventeenth transistor M17 is connected to the second reset signal terminal RST2, and a second electrode of the seventeenth transistor M17 is connected to the second power supply voltage terminal VDD2.

It will be noted that, in the embodiments of the present disclosure, the first electrode is one of a source and a drain of a transistor, and the second electrode is the other one of the source and the drain of the transistor. Since the source and the drain of the transistor may be symmetrical in structure, there may be no difference between a structure of the source and a structure of the drain. That is, the first electrode and the second electrode of the transistor in the embodiments of the present disclosure may be the same in structure. For example, regarding to the P-type transistor, the second electrode is the drain, and the first electrode is the source. For another example, regarding to the N-type transistor, the first electrode is the drain, and the second electrode is the source.

In the shift register circuit provided by the embodiments of the present disclosure, the first node N1, the second node N2, the third node N3 and the fourth node N4 do not represent actual components, but rather represent junctions of related electrical connections in a circuit diagram. That is, these nodes are nodes equivalent to the junctions of the related electrical connections in the circuit diagram.

In the shift register circuit RS provided by the embodiments of the present disclosure, specific implementation manners of each sub-circuit are not limited to the manners described above, and may be any implementation manner used, such as a conventional connection manner well known to those skilled in the art, as long as corresponding functions may be achieved. The above examples do not limit the protection scope of the present disclosure. In practical applications, those skilled in the art may choose to use or not to use one or more of the above circuits according to situations. Various combinations and modifications based on the above circuits do not depart from the principle of the present disclosure, and details are not described herein again.

Hereinafter, with reference to FIG. 11B (FIG. 11B shows a signal timing diagram of the shift register circuit RS in FIG. 11A), working conditions of the shift register circuit RS in FIG. 11B in different phases of an image frame will be illustrated. All the transistors in FIG. 11A are N-type transistors, and the first signal input terminal IN1 and the second signal input terminal IN2 are the same signal input terminal. The first voltage signal from the first power supply voltage terminal VDD1 and the third voltage signal from the third power supply voltage terminal VDD3 are both high voltage signals, and the second voltage signal from the second power supply voltage terminal VDD2 is a low voltage signal.

In the first phase T1':

The first input signal from the first signal input terminal IN1 is a high voltage signal in the first phase T1', and the first transistor M1 and the second transistor M2 are turned on. The second input signal is transmitted to the first node N1 through the turned-on first transistor M1 and the second transistor M2, and the capacitor C1 is charged.

Since the voltage at the first node N1 is a high voltage, the eighth transistor M8 and the ninth transistor M9 are turned on. The first clock signal from the first clock signal terminal CLKD and the second clock signal from the second clock signal terminal CLKE are low voltage signals in the first phase T1', the first clock signal is transmitted to the first output terminal O1 through the turned-on eighth transistor M8, and the second clock signal is transmitted to the second output terminal O2 through the turned-on ninth transistor M9. In the first phase, the first output terminal O1 and the second output terminal O2 both output low voltage signals.

The first voltage signal is a high voltage signal, and the third transistor M3 is turned on. The voltage at the first node N1 is a high voltage, and the fourth transistor M4 is turned on. Since the width-to-length ratio of the channel of the fourth transistor M4 is greater than the width-to-length ratio of the channel of the third transistor M3, the second voltage signal of the second power supply voltage terminal VDD2 is transmitted to the second node N2 through the turned-on fourth transistor M4, and the voltage at the second node N2 is a low voltage. The voltage at the second node N2 is a low voltage, and the sixth transistor M6, the twelfth transistor M12, the thirteenth transistor M13, the fourteenth transistor M14 and the fifteenth transistor M15 are all in a turn-off state.

The third voltage signal is a high voltage signal, and the fifth transistor M5 is turned on. Since the sixth transistor M6 is in the turn-off state, the seventh transistor is turned on. The width-to-length ratio of the channel of the seventh transistor M7 is greater than the width-to-length ratio of the channel of the first transistor M1 and the width-to-length ratio of the channel of the second transistor M2. The third voltage signal is transmitted to the fourth node N4 through the turned-on fifth transistor M5, and is transmitted from the fourth node N4 to the third node N3 through the turned-on seventh transistor M7. That is, in the first phase, the voltage at the third node N3 is a high voltage.

The first reset signal from the first reset signal terminal RST1 and the second reset signal from the second reset signal terminal RST2 are both low voltage signals in the first phase Therefore, the tenth transistor M10, the eleventh transistor M11, the sixteenth transistor M16 and the seventeenth transistor M17 are all in a turn-off state.

Since voltages of the first reset signal, the second reset signal and the second voltage signal at the second node N2 are constant in the first phase, and the second electrodes of the tenth transistor M10, the twelfth transistor M12 and the sixteenth transistor M16 are all connected to the third node N3, a gate-source voltage difference of the sixteenth transistor M16, a gate-source voltage difference of the tenth transistor M10 and a gate-source voltage difference of the twelfth transistor M12 are all reduced, and the tenth transistor M10, the twelfth transistor M12 and the sixteenth transistor M16 are completely turned off. In this way, the voltage at the first node N1 may be prevented from leaking through the tenth transistor M10, the twelfth transistor M12, the sixteenth transistor M16, and the normal output of the shift register circuit RS may be ensured.

In a second phase T2':

The first input signal is a low voltage signal in the second phase T2', and the first transistor M1 and the second transistor M2 are turned off. The voltage stored by the capacitor C1 in the first phase T1' keeps the first node N1 at the high voltage, and keeps the eighth transistor M8 and the ninth transistor M9 still in the turn-on state. The first clock signal is a high voltage signal in the second phase T2', and the first clock signal is transmitted to the first output terminal O1 through the turned-on eighth transistor M8. The second clock signal is a high voltage signal in the second phase T2', and the second clock signal is transmitted to the second output terminal O2 through the turned-on ninth transistor M9. That is, the first output terminal O1 and the second output terminal O2 both output high voltage signals in the second phase.

Since one end of the capacitor C1 is connected to the first node N1, and the other end of the capacitor C1 is connected to the first output terminal O1, in the second phase T2', the capacitor C1 further raises the voltage at the first node N1 through its own coupling effect and bootstrap effect.

In this case, the fourth transistor M4 maintains in the turn-on state, and the sixth transistor M6, the twelfth transistor M12, the thirteenth transistor M13, the fourteenth transistor M14 and the fifteenth transistor M15 all maintain in the turn-off state. The voltage at the third node N3 is still a high voltage.

The first reset signal and the second reset signal are still low voltage signals in the second phase T2', and the tenth transistor M10, the eleventh transistor M11, the sixteenth transistor M16 and the seventeenth transistor M17 are all maintain in the turn-off state.

Since the voltages of the first reset signal, the second reset signal, the first input signal and the second voltage signal at the second node N2 are constant in the first phase, and the second electrodes of the second transistor M2, the tenth transistor M10, the twelfth transistor M12 and the sixteenth transistor M16 are all connected to the third node N3, the gate-source voltage difference of the second transistor M2, the gate-source voltage difference of the sixteenth transistor M16, the gate-source voltage difference of the tenth transistor M10 and the gate-source voltage difference of the twelfth transistor M12 are all reduced, and the second transistor M2, the tenth transistor M10, the twelfth transistor M12, and the sixteenth transistor M16 are completely turned off. In this way, the voltage at the first node N1 may be prevented from leaking through the second transistor M2, the tenth transistor M10, the twelfth transistor M12 and the sixteenth transistor M16, and the normal output of the shift register circuit RS is ensured.

In a third phase T3':

The eighth transistor M8 and the ninth transistor M9 maintain in the turn-on state. The first clock signal is a low voltage signal in the third phase T3', and the first clock signal is transmitted to the first output terminal O1 through the turned-on eighth transistor M8. The second clock signal is a low voltage signal in the third phase T3', and the second clock signal is transmitted to the second output terminal O2 through the turned-on ninth transistor M9. That is, the first output terminal O1 and the second output terminal O2 both output low voltage signals in the third phase.

In the third phase T3', the voltage at the first node N1 drops to the voltage at the first node N1 in the first phase T1'. Remaining transistors maintain the state in the second phase T2'.

The first phase T1', the second phase T2', and the third phase T3' all belong to the output phase.

In a fourth phase T4':

The first reset signal is a high voltage signal in the fourth phase T4', the tenth transistor M10 and the eleventh transistor M11 are turned on, and the second voltage signal from the second power supply voltage terminal VDD2 is transmitted to the first node N1 through the turned-on tenth transistor M10 and the eleventh transistor M11, so as to reset the first node N1.

Since the voltage at the first node N1 is a low voltage, the fourth transistor M4, the eighth transistor M8 and the ninth transistor M9 are turned off. The fourth transistor M4 is turned off, so that the first voltage signal from the first power supply voltage terminal VDD1 is transmitted to the second node N2, and the voltage at the second node N2 becomes a high voltage. The sixth transistor M6, the twelfth transistor M12, the thirteenth transistor M13, the fourteenth transistor M14 and the fifteenth transistor M15 are turned on.

Since the width-to-length ratio of the channel of the sixth transistor M6 is greater than the width-to-length ratio of the channel of the fifth transistor M5, the second voltage signal is transmitted to the fourth node N4 through the turned-on sixth transistor M6, and the seventh transistor M7 is turned off. Since the seventh transistor M7 is turned off, the fourth node N4 and the third node N3 are disconnected. In this case, the third node N3 is in a floating state.

The second voltage signal is transmitted to the first node N1 through the turned-on twelfth transistor M12 and the thirteenth transistor M13 to perform noise reduction on the first node N1. The second voltage signal is transmitted to the first output terminal O1 through the turned-on fourteenth transistor M14 to perform noise reduction on the first output terminal O1. The second voltage signal is transmitted to the second output terminal O2 through the turned-on fifteenth transistor M15 to perform noise reduction on the second output terminal O2. In the fourth phase T4', the first output terminal O1 and the second output terminal O2 output low voltage signals.

In addition, in a reset phase before a start of the first phase T1' or after completion of the fourth phase T4', a second reset signal is applied to the second reset signal terminal RST2. The second reset signal is a high voltage signal in the reset phase, and the sixteenth transistor M16 and the seventeenth transistor M17 are turned on. The second voltage signal is transmitted to the first node N1 through the turned-on sixteenth transistor M16 and the seventeenth transistor M17, thereby preventing an electrical signal remaining on the first node N1 within duration of a previous frame from affecting an image of a current frame, or preventing an electrical signal remaining on the first node N1 within duration of the current frame from affecting an image of a next frame.

Figure 12:
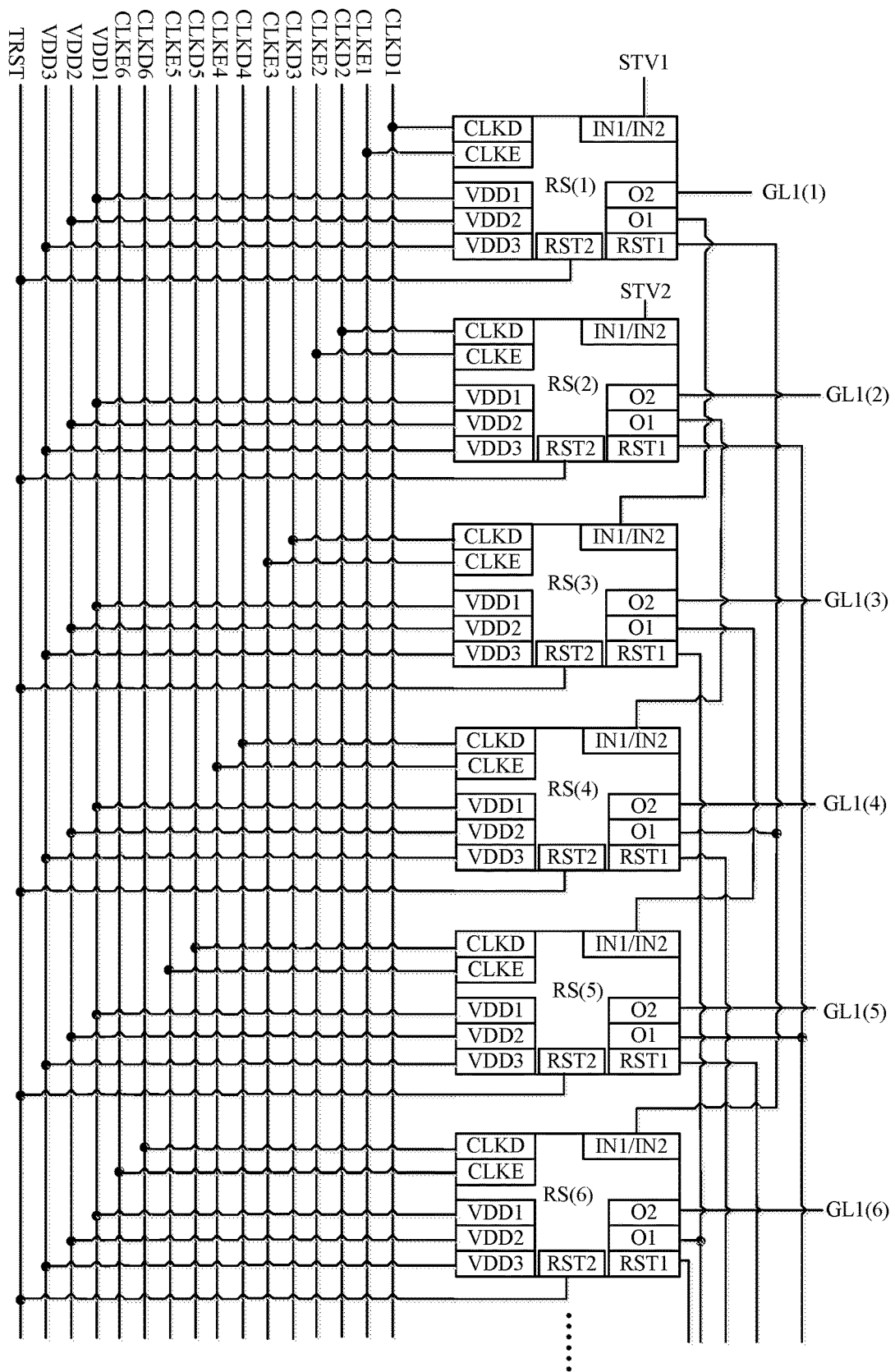
FIG. 12 is a block diagram showing a structure of a gate drive circuit in accordance with some embodiments.

Some embodiments of the present disclosure provide a gate drive circuit 10'. As shown in FIG. 12, the gate drive circuit includes a plurality of stages of shift register circuits (RS(1) ... RS(N)), and each stage of the shift register circuit RS employs a shift register circuit RS in any of the above embodiments.

In some examples, as shown in FIG. 12, in a case where the first signal input terminal IN1 and the second signal input terminal IN2 are the same signal terminal, a first signal input terminal IN1 of a first-stage shift register circuit RS(1) is connected to a first start signal line STV1, and a first signal input terminal IN1 of a second-stage shift register circuit RS(2) is connected to a second start signal line STV2. The first start signal line STV1 is configured to transmit a first start signal, and the second start signal line STV2 is configured to transmit a second start signal. The first-stage shift register circuit RS(1) and the second-stage shift register circuit RS(2) of the gate drive circuit 10' start to work after receiving the first start signal and the second start signal, respectively. Second reset terminals RST2 of all shift register circuits RS are all connected to a reset signal line TRST.

For example, a time when the first-stage shift register circuit RS(1) receives the first start signal is different from a time when the second-stage shift register circuit RS(2) receives the second start signal. For example, the first-stage shift register circuit RS(1) receives the first start signal in a first time period and starts to work, and the second-stage shift register circuit RS(2) receives the start signal in a second time period and starts to work. A start time of the first time period is earlier than a start time of the second time period. The embodiments of the present disclosure do not limit the start time of the first time period and the start time of the second time period, and those skilled in the art can set reasonably according to actual needs.

A first signal input terminal IN1 of a Nth-stage shift register circuit RS(N) is connected to a first output terminal O1 of a (N−2)th-stage shift register circuit, and a first reset signal terminal RST1 of the Nth-stage shift register circuit RS(N) is connected to a first output terminal O1 of a (N+3)th-stage shift register circuit. Herein, N is an integer greater than 2.

That is, as shown in FIG. 12, a reset signal terminal RST1 of the first-stage shift register circuit RS(1) is connected to a first output terminal O1 of a fourth-stage shift register circuit RS(4). A reset signal terminal RST1 of the second-stage shift register circuit RS(2) is connected to a first output terminal O1 of a fifth-stage shift register circuit RS(5). A first signal input terminal IN1 of a third-stage shift register circuit RS(3) is connected to a first output terminal O1 of the first-stage shift register circuit RS(1), and a first reset signal terminal RST1 of the third-stage shift register circuit RS(3) is connected to a first output terminal O1 of a sixth-stage shift register circuit RS(6). A first signal input terminal IN1 of the fourth-stage shift register circuit RS(4) is connected to a first output terminal O1 of the second-stage shift register circuit RS(2), and a first reset signal terminal RST1 of the fourth-stage shift register circuit RS(4) is connected to a first output terminal O1 of a seventh-stage shift register circuit RS(7) (not shown in FIG. 12). A first signal input terminal IN1 of the fifth-stage shift register circuit RS(5) is connected to a first output terminal O1 of the third-stage shift register circuit RS(3), and a first reset signal terminal RST1 of the fifth-stage shift register circuit RS(5) is connected to a first output terminal O1 of an eighth-stage shift register circuit RS(8) (not shown in FIG. 12). A first signal input terminal IN1 of the sixth-stage shift register circuit RS(6) is connected to a first output terminal O1 of the fourth-stage shift register circuit RS(4), and a first reset signal terminal RST1 of the sixth-stage shift register circuit RS(6) is connected to a first output terminal O1 of a ninth-stage shift register circuit RS(9) (not shown in FIG. 12), and so on.

First reset signal terminals RST1 of the last three stages of shift register circuit RS may be connected to a reset signal line. Herein, it will be noted that, the reset signal line is different from the reset signal line TRST.

For example, a first power supply voltage terminal VDD1 of a shift register circuit RS in each stage is connected to a first power supply voltage line; a second power supply voltage terminal VDD2 of a shift register circuit RS in each stage is connected to a second power supply voltage line; a third power supply voltage terminal VDD3 of a shift register circuit RS in each stage is connected to a third power supply voltage line. Herein, the first power supply voltage line and the third power supply voltage line may be the same power supply voltage line.

In addition, a first clock signal terminal CLKD of the Nth-stage shift register circuit RS(N) and a first clock signal terminal CLKD of the (N+3)th-stage shift register circuit RS(N+3) are connected to different first clock signal lines. For example, as shown in FIG. 12, a first clock signal terminal CLKD of the first-stage shift register circuit RS(1) is connected to a first first clock signal line CLKD1, a first clock signal terminal CLKD of the second-stage shift register circuit RS(2) is connected to a second first clock signal line CLKD2, a first clock signal terminal CLKD of the third-stage shift register circuit RS(3) is connected to a third first clock signal line CLKD3, a first clock signal terminal CLKD of the fourth-stage shift register circuit RS(4) is connected to a fourth first clock signal line CLKD4, a first clock signal terminal CLKD of the fifth-stage shift register circuit RS(5) is connected to a fifth first clock signal line CLKD5, a first clock signal terminal CLKD of the sixth-stage shift register circuit RS(6) is connected to a sixth first clock signal line CLKD6, a first clock signal terminal CLKD of the seventh-stage shift register circuit RS(7) is connected to a seventh first clock signal line (not shown in FIG. 12), and a first clock signal terminal CLKD of the eighth-stage shift register circuit RS(8) is connected to an eighth first clock signal line (not shown in FIG. 12). In this way, eight stages of shift register circuits RS are taken as one cycle, and they are arranged in sequence by cycling. There is a certain phase difference among first clock signals transmitted by the first first clock signal line CLKD1, the second first clock signal line CLKD2, the third first clock signal line CLKD3, the fourth first clock signal line CLKD4, the fifth first clock signal line CLKD5, the sixth first clock signal line CLKD6, the seventh first clock signal line and the eighth first clock signal line.

A second clock signal terminal CLKE of the Nth-stage shift register circuit RS(N) and a second clock signal terminal CLKE of the (N+3)th-stage shift register circuit RS(N+3) are connected to different second clock signal lines. For example, as shown in FIG. 12, a second clock signal terminal CLKE of the first-stage shift register circuit RS(1) is connected to a first second clock signal line CLKE1, a second clock signal terminal CLKE of the second-stage shift register circuit RS(2) is connected to a second second clock signal line CLKE2, a second clock signal terminal CLKE of the third-stage shift register circuit RS(3) is connected to a third second clock signal line CLKE3, a second clock signal terminal CLKE of the fourth-stage shift register circuit RS(4) is connected to a fourth second clock signal line CLKE4, a second clock signal terminal CLKE of the fifth-stage shift register circuit RS(5) is connected to a fifth second clock signal line CLKE5, a second clock signal terminal CLKE of the sixth-stage shift register circuit RS(6) is connected to a sixth second clock signal line CLKE6, a second clock signal terminal CLKE of the seventh-stage shift register circuit RS(7) is connected to a seventh second clock signal line (not shown in FIG. 12), and a second clock signal terminal CLKE of the eighth-stage shift register circuit RS (8) is connected to an eighth second clock signal line (not shown in FIG. 12). In this way, eight stages of shift register circuits RS are taken as one cycle, and they are arranged in sequence by cycling. There is a certain phase difference among second clock signals transmitted by the first second clock signal line CLKE1, the second second clock signal line CLKE2, the third second clock signal line CLKE3, the fourth second clock signal line CLKE4, the fifth second clock signal line CLKE5, the sixth second clock signal line CLKE6, the seventh second clock signal line and the eighth second clock signal line.

It will be noted that, the embodiments of the present disclosure do not limit a cascade manner of the plurality of stages of shift register circuits (RS(1) . . . RS(N)) in the gate drive circuit 10'. Except for the cascade manner described in the above embodiments, those skilled in the art may also make reasonably arrangement according to the actual situation, for example, the plurality of stages of shift register circuits (RS(1) . . . RS(N)) are cascaded in sequence.

Some embodiments of the present disclosure further provide a display device. The display device may be any device that displays an image whether moving (such as a video) or fixed (such as a static image), and whether literal. More specifically, it is contemplated that the described embodiments may be implemented in or associated with a variety of electronic devices. The variety of electronic devices may include (but not limit to), for example, mobile telephones, wireless devices, personal digital assistant (PDA), hand-held or portable computers, global positioning system (GPS) receivers/navigators, cameras, MPEG-4 Part 14 (MP4) video players, vidicons, game consoles, watches, clocks, calculators, TV monitors, flat panel displays, computer monitors, car displays (such as odometer display), navigators, cockpit controllers and/or displays, camera view displays (such as rear view camera display in a vehicle), electronic photos, electronic billboards or signages, projectors, building structures, packaging and aesthetic structures (such as a display for an image of a piece of jewelry).

In some embodiments, the display apparatus includes the display panel 100 as shown in FIG. 1, the display panel 100 includes the gate drive circuit 10' according to any one of the above embodiments.

Some embodiments of the present disclosure further provide a driving method of the shift register circuit RS according to any one of the embodiments above. As shown in FIGS. 4A and 4B, the driving method includes:

Transmitting, by the input sub-circuit 10, the second input signal from the second signal input terminal IN2 to the first node N1 in response to the first input signal received from the first signal input terminal IN1.

Storing, by the output sub-circuit 20, the second input signal at the first node N1, and transmitting the first clock signal from the first clock signal terminal CLKD to the first output terminal O1 in response to the signal at the first node N1.

Transmitting, by the first control sub-circuit 30, the first voltage signal to the second node N2 in response to the first voltage signal received from the first power supply voltage terminal VDD1, and transmitting, by the first control sub-circuit 30, the second voltage signal from the second power supply voltage terminal VDD2 to the second node N2 in response to the signal at the first node N1.

Transmitting, by the second control sub-circuit 40, the third voltage signal to the third node N3 in response to the third voltage signal received from the third power supply voltage terminal VDD3, and disconnecting, by the second control sub-circuit 40, the third power supply voltage terminal VDD3 from the third node N3 in response to the first voltage signal at the second node N2 and the second voltage signal from the second power supply voltage terminal VDD2.

The driving method of the shift register circuit RS has the same beneficial effects as the shift register circuit RS, which will not be described in detail again.

The foregoing descriptions are merely specific implementations of the present disclosure, but the protection scope of the present disclosure is not limited thereto. Any changes or replacements that those skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register circuit, comprising:
    an input sub-circuit connected to a first signal input terminal, a second signal input terminal and a first node, and the input sub-circuit being configured to transmit a second input signal from the second signal input terminal to the first node in response to a first input signal received from the first input signal terminal;
    an output sub-circuit connected to the first node, a first clock signal terminal and a first output terminal, and the output sub-circuit being configured to store the second input signal at the first node, and transmit a first clock signal from the first clock signal terminal to the first output terminal in response to the second input signal at the first node;
    a first control sub-circuit connected to a first power supply voltage terminal, a second power supply voltage terminal, the first node and a second node, and the first control sub-circuit being configured to transmit a first voltage signal to the second node in response to the first voltage signal received from the first power supply voltage terminal, and transmit a second voltage signal to the second node in response to the second input signal at the first node; and
    a second control sub-circuit connected to the second power supply voltage terminal, a third power supply voltage terminal, the second node and a third node, the third node being connected to the input sub-circuit, and the second control sub-circuit being configured to transmit a third voltage signal to the third node in response to the third voltage signal received from the third power supply voltage terminal, and disconnect the third power supply voltage terminal from the third node in response to the first voltage signal at the second node and the second voltage signal from the second power supply voltage terminal.

2. The shift register circuit according to claim 1, wherein the input sub-circuit includes a first transistor and a second transistor;
    a gate of the first transistor is connected to the first signal input terminal, a first electrode of the first transistor is connected to the second signal input terminal, and a second electrode of the first transistor is connected to a first electrode of the second transistor;
    a gate of the second transistor is connected to the first signal input terminal, and a second electrode of the second transistor is connected to the first node; and
    the first electrode of the second transistor is further connected to the third node.

3. The shift register circuit according to claim 1, wherein the first control sub-circuit includes a third transistor and a fourth transistor;
    a gate and a first electrode of the third transistor are both connected to the first power supply voltage terminal, and a second electrode of the third transistor is connected to the second node;
    a gate of the fourth transistor is connected to the first node, a first electrode of the fourth transistor is connected to the second node, and a second electrode of the fourth transistor is connected to the second power supply voltage terminal; and
    a width-to-length ratio of a channel of the fourth transistor is greater than a width-to-length ratio of a channel of the third transistor.

4. The shift register circuit according to claim 1, wherein the second control sub-circuit includes a fifth transistor, a sixth transistor and a seventh transistor;
    a gate and a first electrode of the fifth transistor are both connected to the third power supply voltage terminal, and a second electrode of the fifth transistor is connected to a fourth node;
    a gate of the sixth transistor is connected to the second node, a first electrode of the sixth transistor is connected to the fourth node, and a second electrode of the sixth transistor is connected to the second power supply voltage terminal;
    a gate and a first electrode of the seventh transistor are both connected to the fourth node, and a second electrode of the seventh transistor is connected to the third node; and
    a width-to-length ratio of a channel of the sixth transistor is greater than a width-to-length ratio of a channel of the fifth transistor.

5. The shift register circuit according to claim 1, wherein the output sub-circuit includes an eighth transistor and a capacitor;
    a gate of the eighth transistor is connected to the first node, a first electrode of the eighth transistor is connected to the first clock signal terminal, and a second electrode of the eighth transistor is connected to the first output terminal; and
    one end of the capacitor is connected to the first node, and another end of the capacitor is connected to the first output terminal.

6. The shift register circuit according to claim 1, wherein the output sub-circuit is further connected to a second clock signal terminal and a second output terminal; and the output sub-circuit is further configured to transmit a second clock signal of the second clock signal terminal to the second output terminal in response to the second input signal at the first node.

7. The shift register circuit according to claim 6, wherein the output sub-circuit includes an eighth transistor, a ninth transistor and a capacitor;
- a gate of the eighth transistor is connected to the first node, a first electrode of the eighth transistor is connected to the first clock signal terminal, and a second electrode of the eighth transistor is connected to the first output terminal;
- a gate of the ninth transistor is connected to the first node, a first electrode of the ninth transistor is connected to the second clock signal terminal, and a second electrode of the ninth transistor is connected to the second output terminal; and
- one end of the capacitor is connected to the first node, and another end of the capacitor is connected to the first output terminal.

8. The shift register circuit according to claim 1, further comprising:
- a first reset sub-circuit connected to a first reset signal terminal, the first node and the second power supply voltage terminal, and the first reset sub-circuit being configured to transmit the second voltage signal to the first node in response to a first reset signal received from the first reset signal terminal, so as to reset the first node.

9. The shift register circuit according to claim 8, wherein the first reset sub-circuit includes a tenth transistor and a eleventh transistor;
- a gate of the tenth transistor is connected to the first reset signal terminal, a first electrode of the tenth transistor is connected to the first node, and a second electrode of the tenth transistor is connected to a first electrode of the eleventh transistor; and
- a gate of the eleventh transistor is connected to the first reset signal terminal, and a second electrode of the eleventh transistor is connected to the second power supply voltage terminal;
- the second electrode of the tenth transistor is further connected to the third node.

10. The shift register circuit according to claim 1, further comprising:
- a denoising sub-circuit connected to the first node, the second node, the first output terminal and the second power supply voltage terminal, and the denoising sub-circuit being configured to transmit the second voltage signal to the first node and the first output terminal in response to the first voltage signal at the second node.

11. The shift register circuit according to claim 10, wherein the denoising sub-circuit includes a first denoising sub-circuit and a second denoising sub-circuit;
- the first denoising sub-circuit is connected to the first node, the second node and the second power supply voltage terminal, and the first denoising sub-circuit is configured to transmit the second voltage signal to the first node in response to the first voltage signal at the second node; and
- the second denoising sub-circuit is connected to the second node, the first output terminal and the second power supply voltage terminal, and the second denoising sub-circuit is configured to transmit the second voltage signal to the first output terminal in response to the first voltage signal at the second node.

12. The shift register circuit according to claim 11, wherein
the first denoising sub-circuit includes a twelfth transistor and a thirteenth transistor;
- a gate of the twelfth transistor is connected to the second node, a first electrode of the twelfth transistor is connected to the first node, a second electrode of the twelfth transistor is connected to a first electrode of the thirteenth transistor, and the second electrode of the twelfth transistor is further connected to the third node; and
- a gate of the thirteenth transistor is connected to the second node, and the second electrode of the thirteenth transistor is connected to the second power supply voltage terminal.

13. The shift register circuit according to claim 11, wherein the output sub-circuit is further connected to a second clock signal terminal and a second output terminal;
- the denoising sub-circuit further includes a third denoising sub-circuit, and the third denoising includes fifteenth transistor; and
- a gate of the fifteenth transistor is connected to the second node, the first electrode of the fifteenth transistor is connected to the second output terminal, and the second electrode of the fifteenth transistor is connected to the second power supply voltage terminal.

14. The shift register circuit according to claim 11, wherein
the second denoising sub-circuit includes a fourteenth transistor; and
- a gate of the fourteenth transistor is connected to the second node, a first electrode of the fourteenth transistor is connected to the first output terminal, and a second electrode of the fourteenth transistor is connected to the second power supply voltage terminal.

15. The shift register circuit according to claim 1, further comprising:
- a second reset sub-circuit connected to a second reset signal terminal, the first node and the second power supply voltage terminal, and the second reset sub-circuit being configured to transmit the second voltage signal to the first node in response to a second reset signal received from the second reset signal terminal, so as to reset the first node.

16. The shift register circuit according to claim 15, wherein the second reset sub-circuit includes a sixteenth transistor and a seventeenth transistor;
- a gate of the sixteenth transistor is connected to the second reset signal terminal, a first electrode of the sixteenth transistor is connected to the first node, and a second electrode of the sixteenth transistor is connected to a first electrode of the seventeenth transistor and the third node; and
- a gate of the seventeenth transistor is connected to the second reset signal terminal, and a second electrode of the seventeenth transistor is connected to the second power supply voltage terminal.

17. A gate drive circuit, comprising a plurality of stages of shift register circuits, each stage of shift register circuit being the shift register circuit according to claim 1.

18. The gate drive circuit according to claim 17, wherein a first signal input terminal and a first reset signal terminal of a Nth-stage shift register circuit are respectively connected to a first output terminal of a (N−2)th-stage shift register circuit and a first output terminal of a (N+3)th-stage shift register circuit, where N is an integer greater than 2.

19. A display device, comprising the gate drive circuit according to claim 17.

20. A driving method of a shift register circuit, the driving method being used for driving the shift register circuit according to claim 1, the driving method comprising:

transmitting, by the input sub-circuit, the second input signal from the second signal input terminal to the first node in response to the first input signal received from the first signal input terminal;

storing, by the output sub-circuit, the second input signal at the first node;

transmitting, by the output sub-circuit, the first clock signal of the first clock signal terminal to the first output terminal in response to the second input signal at the first node;

transmitting, by the first control sub-circuit, the first voltage signal to the second node in response to the first voltage signal received from the first power supply voltage terminal;

transmitting, by the first control sub-circuit, the second voltage signal of the second power supply voltage terminal to the second node in response to the second input signal at the first node;

transmitting, by the second control sub-circuit, the third voltage signal to the third node in response to the third voltage signal received from the third power supply voltage terminal; and disconnecting, by the second control sub-circuit, the third power supply voltage terminal from the third node in response to the first voltage signal at the second node and the second voltage signal from the second power supply voltage terminal.

* * * * *